US009183925B2

(12) United States Patent
Katoh et al.

(10) Patent No.: US 9,183,925 B2
(45) Date of Patent: Nov. 10, 2015

(54) VARIABLE RESISTANCE NONVOLATILE MEMORY DEVICE AND METHOD OF PERFORMING THE FORMING OPERATION

(71) Applicant: Panasonic Corporation, Osaka (JP)

(72) Inventors: Yoshikazu Katoh, Osaka (JP); Ryotaro Azuma, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 50 days.

(21) Appl. No.: 14/123,787

(22) PCT Filed: Apr. 4, 2013

(86) PCT No.: PCT/JP2013/002339
§ 371 (c)(1),
(2) Date: Dec. 4, 2013

(87) PCT Pub. No.: WO2013/153786
PCT Pub. Date: Oct. 17, 2013

(65) Prior Publication Data
US 2014/0104931 A1    Apr. 17, 2014

(30) Foreign Application Priority Data

Apr. 9, 2012 (JP) .................................. 2012-088629

(51) Int. Cl.
*G11C 11/56* (2006.01)
*G11C 13/00* (2006.01)
*G11C 11/16* (2006.01)

(52) U.S. Cl.
CPC ........ *G11C 11/5685* (2013.01); *G11C 13/0007* (2013.01); *G11C 13/0038* (2013.01);
(Continued)

(58) Field of Classification Search
CPC .. G11C 11/5685; G11C 11/15; G11C 11/106; G11C 7/062; G11C 13/0038; G11C 13/004; G11C 13/0069; G11C 13/0097; G11C 13/0007; G11C 13/0064; G11C 13/0083; G11C 2213/32; G11C 2213/72
See application file for complete search history.

(56) References Cited

U.S. PATENT DOCUMENTS 6,992,920 B2    1/2006 Tamai et al.
7,027,342 B2    4/2006 Inoue
(Continued)

FOREIGN PATENT DOCUMENTS

JP    2005-032401    2/2005
JP    2008-052896    3/2008
(Continued)

OTHER PUBLICATIONS

International Search Report issued May 14, 2013 in International (PCT) Application No. PCT/JP2013/002339.

*Primary Examiner* — Richard Elms
*Assistant Examiner* — Ajay Ojha
(74) *Attorney, Agent, or Firm* — Wenderoth, Lind & Ponack, L.L.P.

(57) ABSTRACT

A nonvolatile memory device including a control unit configured to read resistance value information for each of memory cells as initial resistance value information and store it temporarily before a voltage pulse for forming is applied, to set resistance value information as a threshold value serving as a target for completion of the forming, the resistance value information being obtained by multiplying the initial resistance value information by a predetermined coefficient, and to repeat application of the voltage pulse for forming and reading of the resistance value information until a resistance value indicated by the resistance value information on the memory cell becomes lower than a resistance value indicated by the threshold value.

13 Claims, 11 Drawing Sheets

(52) U.S. Cl.
CPC ........ *G11C13/0064* (2013.01); *G11C 13/0069* (2013.01); *G11C 11/16* (2013.01); *G11C 2013/0083* (2013.01); *G11C 2213/32* (2013.01); *G11C 2213/72* (2013.01)

(56) References Cited

U.S. PATENT DOCUMENTS

| | | | |
|---|---|---|---|
| 7,324,370 | B2 | 1/2008 | Smith et al. |
| 7,869,253 | B2 | 1/2011 | Liaw et al. |
| 7,965,565 | B2 | 6/2011 | Jung et al. |
| 8,120,944 | B2 | 2/2012 | Kawabata et al. |
| 8,274,815 | B2 | 9/2012 | Ichihara et al. |
| 8,331,177 | B2 | 12/2012 | Sasaki |
| 8,345,466 | B2 | 1/2013 | Maejima et al. |
| 8,392,770 | B2 * | 3/2013 | Toda ............................. 714/721 |
| 8,411,486 | B2 | 4/2013 | Sekine et al. |
| 8,498,141 | B2 | 7/2013 | Sasaki et al. |
| 2001/0048608 | A1 * | 12/2001 | Numata et al. ................. 365/158 |
| 2004/0257864 | A1 | 12/2004 | Tamai et al. |
| 2005/0276138 | A1 | 12/2005 | Inoue |
| 2006/0245234 | A1 * | 11/2006 | Hush et al. .................... 365/100 |
| 2008/0043521 | A1 | 2/2008 | Liaw et al. |
| 2010/0232209 | A1 | 9/2010 | Kawabata et al. |
| 2011/0032746 | A1 | 2/2011 | Maejima et al. |
| 2011/0069530 | A1 | 3/2011 | Sekine et al. |
| 2011/0110144 | A1 * | 5/2011 | Kawai et al. .................. 365/148 |
| 2011/0216574 | A1 | 9/2011 | Ichihara et al. |
| 2011/0235396 | A1 | 9/2011 | Sasaki |
| 2011/0235397 | A1 | 9/2011 | Sasaki et al. |
| 2012/0039110 | A1 | 2/2012 | Maejima et al. |
| 2012/0069633 | A1 | 3/2012 | Katoh |
| 2012/0320662 | A1 | 12/2012 | Ichihara et al. |
| 2013/0044534 | A1 | 2/2013 | Kawai et al. |

FOREIGN PATENT DOCUMENTS

| | | |
|---|---|---|
| JP | 4153901 | 9/2008 |
| JP | 2010-218603 | 9/2010 |
| JP | 2011-054259 | 3/2011 |
| JP | 2011-066363 | 3/2011 |
| JP | 2011-181144 | 9/2011 |
| JP | 2011-198445 | 10/2011 |
| JP | 2011-204289 | 10/2011 |
| JP | 2012-038398 | 2/2012 |
| WO | 2011/121970 | 10/2011 |
| WO | 2011/121971 | 10/2011 |

* cited by examiner

VARIABLE RESISTANCE NONVOLATILE MEMORY DEVICE AND METHOD OF PERFORMING THE FORMING OPERATION

TECHNICAL FIELD

The present invention relates to a nonvolatile memory device which stores information using a nonvolatile variable resistance element, and a method of performing forming on the nonvolatile memory device, and particularly to forming process which sets a variable resistance element in a state in which resistance value is reversibly changeable according to an electrical pulse.

BACKGROUND ART

Nonvolatile memory devices (also referred to as nonvolatile storage devices) are installed on many mobile devices such as a mobile phone or a digital camera, and its range of applications is rapidly increasing.

Out of nonvolatile memory devices, particularly, a nonvolatile memory device using, what is called, a variable resistance element is under active research and development. Here, a variable resistance element is an element which has the characteristic that its resistance value reversibly changes between at least two levels of values by electrical signals, and is further capable of storing information corresponding to the resistance value in a nonvolatile manner.

PTL 1 proposes a cross point nonvolatile memory device (hereinafter referred to as a "cross point nonvolatile memory") in which a memory cell array is formed by connecting a memory cell to a corresponding word line (row selection line) and bit line (column selection line), the memory cell being formed by connecting in series a variable resistance element and a current control element (for example, a diode).

CITATION LIST

Patent Literature

[PTL 1]
Japanese Unexamined Patent Application Publication No. 2010-218603
[PTL 2]
Japanese Unexamined Patent Application Publication No. 20-66363
[PTL 3]
Japanese Unexamined Patent Application Publication No. 2011-198445
[PTL 4]
Japanese Unexamined Patent Application Publication No. 2005-32401

SUMMARY OF INVENTION

Technical Problem

In the above-described nonvolatile memory device, in order to change the resistance value reversibly, the variable resistance element needs to be changed to a low resistance state at a predetermined level by previously performing a process of applying a forming voltage (forming process) to the variable resistance element, the forming voltage being higher than a voltage at the time of normal operation.

However, there is a problem in that the variable resistance performance of the variable resistance element after a forming process is varied according to a state of the variable resistance element before the forming process.

Thus, it is an object of the present invention to provide a nonvolatile memory device which performs a stable and accurate forming process on a variable resistance element and allows the variable resistance element to achieve stable resistance change after the forming process.

Solution to Problem

In order to solve the above-mentioned problem, an aspect of the present invention provides a nonvolatile memory device, including: a memory cell having a variable resistance element which is changed to a resistance state which is reversibly changeable according to an electrical pulse, the change being caused by application of a forming voltage to the memory cell; a voltage application unit configured to apply the forming voltage to the memory cell; a reading unit configured to read resistance value information on the memory cell; a memory unit configured to store the resistance value information read by the reading unit as initial resistance value information before the forming voltage is applied to the memory cell, the resistance value information; and a control unit configured to control the voltage application unit and the reading unit to cause the voltage application unit to repeat application of the forming voltage to the memory cell and to cause the reading unit to repeat reading of the resistance value information on the memory cell until the resistance value information on the memory cell read by the reading unit satisfies a condition which is set based on the initial resistance value information.

It is to be noted that this general or specific aspect may be implemented in the form of a system, a method, an integrated circuit, a computer program, or a recording medium and may be implemented in any combination of a system, a method, an integrated circuit, a computer program, and a recording medium. For example, more specifically, a desired operation may be performed by a nonvolatile memory device, an inspection device connected to the nonvolatile memory device, and a program for controlling the devices.

Advantageous Effects of Invention

According to the present invention, a nonvolatile memory device is achieved which is capable of performing stable and proper forming process on a variable resistance element and allowing stable resistance change after the forming process.

DESCRIPTION OF EMBODIMENTS

Knowledge of Foundation of Present Invention

Figure 1:
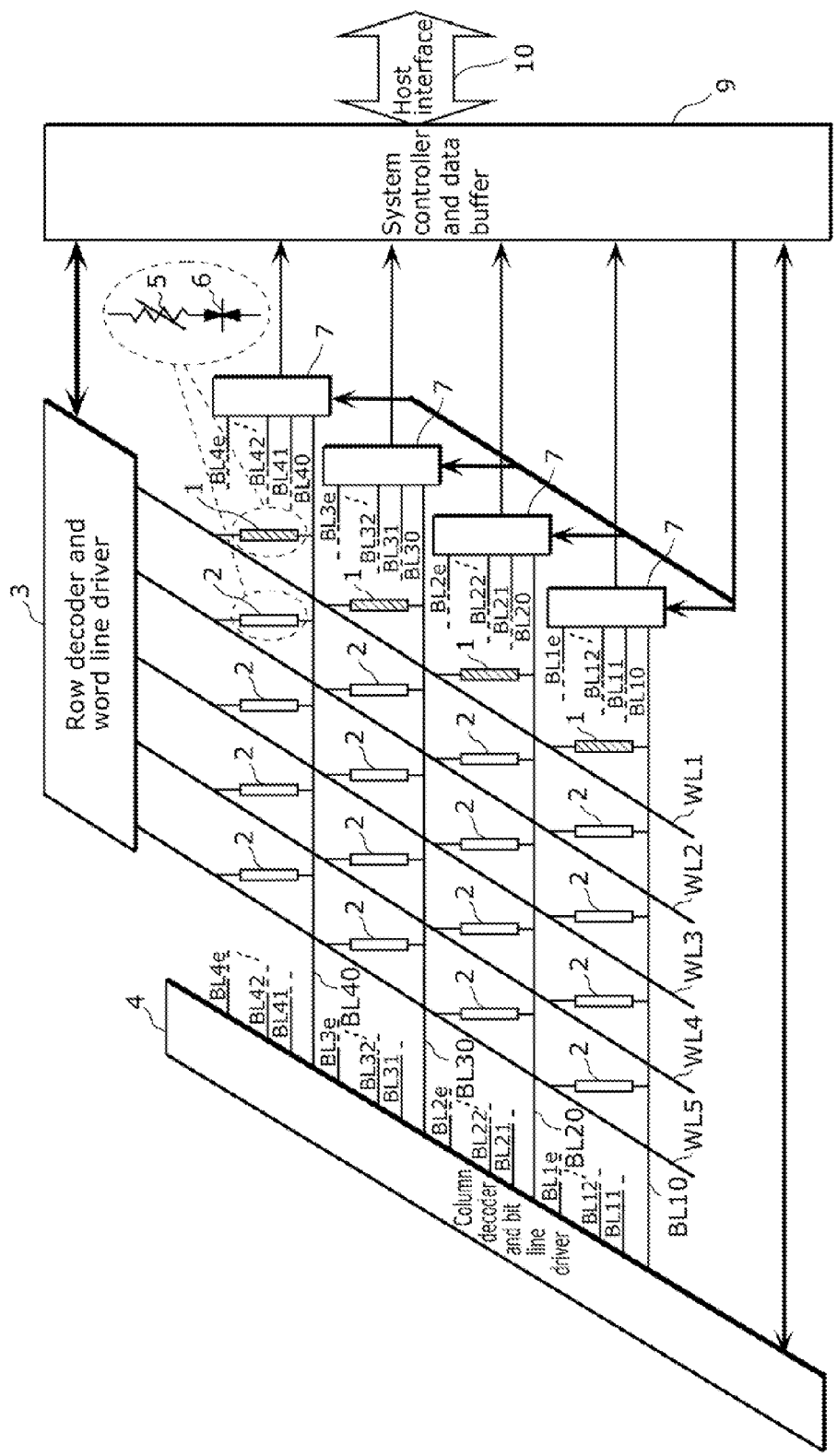
FIG. 1 is a block diagram of a nonvolatile memory device according to the present embodiment.

A nonvolatile memory device (also referred to as a nonvolatile storage device) is installed on many mobile devices such as a mobile phone or a digital camera, and its range of applications is rapidly increasing. For example, in recent years, audio data and/or image data are used in many situations, and thus there is a high demand on the nonvolatile memory device which has a larger capacity and a higher operation speed than ever before. Because such a nonvolatile memory device is often used for the application such as a mobile device, low power consumption is demanded.

In recent years, in order to meet such a demand, there has been proposed a cross point nonvolatile memory device (hereinafter referred to as a "cross point nonvolatile memory") in which a memory cell array is formed by connecting a memory cell to a corresponding word line (row selection line) and bit line (column selection line), the memory cell being formed by connecting in series a memory element and a current control element (for example, a unidirectional diode).

In such a cross point nonvolatile memory, an element for selection such as a switching transistor is no used, and thus it is not necessary to form elements for selection and wiring for control the elements. Thus, the cross point nonvolatile memory allows a memory array to be formed with a high degree of integration based on a wiring rule of minimum pitch, and so is suitable for increasing the capacity.

A cross point memory, particularly, ReRAM (Resistive RAM), whose resistance changes quickly by electrical pulses, adopts a simple structure in which a variable resistance film is interposed between electrodes, and thus it is expected that a highly integrated nonvolatile memory device can be implemented by utilizing wiring layers and plugs in semiconductor process. PTL 1 has proposed ReRAM which includes a three-dimensionally structured memory cell array in which a plurality of cross point nonvolatile memory arrays are layered on a substrate. It is described that the ReRAM is advantageous in that the area of chip can be significantly reduced for achieving the same capacity.

However, PTL 2 describes that the variable resistance film used in the ReRAM is an oxide of a transition metal, and resistance change occurs by formation of a locally low-resistance region (hereinafter referred to as a "filament path" as needed) which is generated in an oxide film, or by breakdown of the filament path. PTL 2 further describes that the variable resistance element is insulated in the initial state after manufacture, and thus in order to cause the variable resistance element to be switchable between a high resistance state (also referred to as a HR state) and a low resistance state (also referred to as a LR state) by electrical stress, it is necessary to form a filament path in the variable resistance element by first applying a voltage to the memory cell immediately after manufacture. This process of forming a filament path in the variable resistance element is referred to as a forming process (hereafter referred to simply as a forming).

PTL 1 describes that a desired resistance change cannot be achieved unless the resistance of the variable resistance element is reduced to a level of a predetermined low resistance state by a forming process. Thus PTL 1 discloses that a resistance value is measured after the application of a voltage, and the voltage application and the resistance measurement are repeated until the measured resistance value falls within a predetermined range. It is also described that the application voltage used in a forming process has multiple levels and the width of pulse to be applied is variable.

In addition, PTL 2 discloses that forming is performed in parallel on a plurality of elements, and voltage application is restricted for each cell for which forming is completed, and thus the time of forming is reduced.

In PTL 3, the cross point nonvolatile memory has an array structure in which a memory cell including a variable resistance element is disposed at each of cross-points of a plurality of first wiring lines and a plurality of second wiring lines, and it is described that when a forming voltage is applied to perform forming on a selected memory cell between a selected first wiring line and a selected second wiring line, leakage current flows through the first wiring and second wiring lines which are not selected. The leakage current increases with time and the forming voltage applied to a selection element gradually decreases. For this reason, it is described in PTL 3 that the leakage current is detected, and the driving current of a driver which applies the forming voltage is compensated according to the amount of the leakage current, so that a voltage drop is prevented and a constant forming voltage is applied to the variable resistance element at all times irrespective of the level of the leakage current.

However, the following problem was found by the analysis of the inventors. In a cross point nonvolatile memory which uses a nonlinear conductive element such as a diode for a selection element of a memory cell, the leakage current increases according to the number of variable resistance elements which have undergone the forming as the forming process advances. Consequently, electrical stress applied to a variable resistance element by the forming process is not constant, and thus the variable resistance performance of the variable resistance element after the forming process is varied.

Thus, the present invention has been devised to achieve the object of providing a nonvolatile memory device which performs a stable and accurate forming process on a variable resistance element and allows the variable resistance element to achieve stable resistance change after the forming process.

The above description has been provided to aid in understanding the below-described embodiments of the present invention, and the present invention is not limited to the above description.

SUMMARY OF PRESENT EMBODIMENT

An aspect of the present invention provides a nonvolatile memory device, including: a memory cell having a variable resistance element which is changed to a resistance state which is reversibly changeable according to an electrical pulse, the change being caused by application of a forming voltage to the memory cell; a voltage application unit configured to apply the forming voltage to the memory cell; a reading unit configured to read resistance value information on the memory cell; a memory unit configured to store the resistance value information read by the reading unit as initial resistance value information before the forming voltage is applied to the memory cell, the resistance value information; and a control unit configured to control the voltage application unit and the reading unit to cause the voltage application unit to repeat application of the forming voltage to the memory cell and to cause the reading unit to repeat reading of the resistance value information on the memory cell until the resistance value information on the memory cell read by the reading unit satisfies a condition which is set based on the initial resistance value information.

With this configuration, even when the apparent resistance value decreases due to an increase in the number of memory cells which have undergone the forming and an increase of the leakage current, a threshold value is automatically updated optimally by storing a resistance value immediately before the forming for each memory cell and using a determination threshold value which is obtained by multiplying the resistance value by a predetermined rate, and thus proper forming can be performed.

The control unit may be configured to control the voltage application unit and the reading unit to cause the voltage application unit to repeat application of the forming voltage to the memory cell and to cause the reading unit to repeat reading of the resistance value information on the memory cell until a resistance value indicated by the resistance value information on the memory cell becomes lower than a resistance value indicated by the initial resistance value information.

The nonvolatile memory device may further include a calculation unit configured to output calculated resistance value information which is obtained by multiplying the initial resistance value information by a predetermined coefficient, wherein the control unit may be configured to control the voltage application unit and the reading unit to cause the voltage application unit to repeat application of the forming voltage to the memory cell and to cause the reading unit to repeat reading of the resistance value information on the memory cell until a resistance value indicated by the resistance value information on the memory cell read by the reading unit becomes lower than a resistance value indicated by the calculated resistance value information.

The reading unit may be a counter circuit which reads a count value as the resistance value information, the count value being obtained by counting an electrical discharge time in a predetermined cycle, the electrical discharge time being a time period after a predetermined read voltage is applied to both ends of the memory cell until a voltage between the both ends of the memory cell reduces to a predetermined reference voltage, the memory unit may be a latch circuit which stores the initial resistance value information read from the memory cell by the counter circuit before forming is performed on the memory cell, and the calculation unit may be a digital calculation circuit which outputs calculated resistance value information which is obtained by multiplying the initial resistance value information by a predetermined coefficient.

The nonvolatile memory device may further include a constant current drive circuit which causes a predetermined current to flow through the memory cell based on control performed by the control unit, wherein the control unit may be configured to (i) adjust the resistance value information by increasing the electrical discharge time using the predetermined current, and (ii) control the voltage application unit and the reading unit to cause the voltage application unit to repeat application of the forming voltage to the memory cell and to cause the reading unit to repeat reading of the resistance value information on the memory cell until a resistance value indicated by the adjusted resistance value information becomes lower than a resistance value indicated by the calculated resistance value information.

In this manner, even when the resistance value of the memory cell decreases due to repeated forming operation, the resolution of the resistance value information can be maintained by increasing the electrical discharge time by the constant current source.

The control unit may be configured to adjust the resistance value information by performing at least one of decreasing the predetermined reference voltage, increasing the predetermined current, and increasing the predetermined read voltage as a resistance value indicated by the resistance value information read by the counter circuit decreases while application of the forming voltage is repeated.

That is, the resolution of the resistance value information can be freely set by adjusting a predetermined current amount of the constant current source, a clock frequency, the reference voltage, and the capacity of a capacitive element.

The reading unit may include a capacitor connected in parallel to the memory cell, and the control unit may be configured to adjust the resistance value information by increasing a capacity of the capacitor as a resistance value indicated by the resistance value information acquired by the counter circuit decreases while application of the forming voltage is repeated.

The control unit may be configured to control the forming voltage so that the forming voltage is reduced as a resistance value indicated by the resistance value information read by the reading unit decreases while application of the forming voltage is repeated.

The control unit may be configured to control a pulse width of the forming voltage, so that the pulse width is reduced as a resistance value indicated by the resistance value information read by the reading unit decreases while application of the forming voltage is repeated.

In this manner, more proper forming can be performed by adjusting the application of the forming voltage.

The reading unit may include a fixed resistor connected in series to the memory cell, and a capacitor connected in parallel to the fixed resistor to serve as a memory unit by storing a potential of the fixed resistor, and the reading unit may be configured to read a potential of the fixed resistor as the resistance value information, the potential being caused by a current which flows from the memory cell through the fixed resistor after a predetermined read voltage is applied to both ends of the memory cell.

The nonvolatile memory device may further include a memory cell array which includes a plurality of the memory cells, wherein the reading unit may be configured to read resistance value information of a subsequent memory cell after the condition is satisfied by the resistance value information on the memory cell, and the memory unit may be configured to store an initial resistance value of the subsequent memory cell.

Using a second threshold value which is set to be lower than a first threshold value which is defined as a calculated resistance value information obtained by multiplying the initial resistance value information by the predetermined coefficient, the control unit may be configured (i) to determine whether or not the resistance value information acquired by the counter circuit is lower than the second threshold value, and (ii) to adjust the resistance value information to cause the resistance value information to exceed the second threshold value by performing at least one of decreasing the predetermined reference voltage, increasing the predetermined current, and increasing the predetermined read voltage when the resistance value information acquired by the counter circuit is determined to be lower than the second threshold value while application of the forming voltage is repeated.

An aspect of the present invention provides a method of performing forming on a nonvolatile memory device which applies a forming voltage to a memory cell having a variable resistance element to change the variable resistance element to a resistance state which is reversibly changeable according to an electrical pulse, the method including: storing resistance value information as initial resistance value information, the resistance value information being read from the memory cell; applying the forming voltage to the memory cell after the storing of the initial resistance value information; reading resistance value information from the memory cell after the applying of the forming voltage to the memory cell; and determining whether or not the resistance value information read in the reading satisfies a condition which is set based on the initial resistance value information, wherein when a result of the determining indicates that the condition is not satisfied, the applying of the forming voltage to the memory cell, the reading of the resistance value information, and the determining are performed.

The nonvolatile memory device may comprise a memory cell array which includes a plurality of the memory cells, and when a result of the determining indicates that the condition is satisfied, the storing of initial resistance value information, the applying of the forming voltage, the reading of resistance value information, and the determining may be performed on another memory cell.

Hereinafter, an embodiment will be described with reference to the drawings.

Each of the embodiments described in the following illustrates a comprehensive or specific example. The numerical values, shapes, materials, components, arrangement positions and connection configurations of the components, steps, the order of the steps shown in the following embodiment each provide an example, and are not intended to limit the present invention. Any component which is included in the components of the following embodiments and not recited in the independent claim that provides the most generic concept will be described as an arbitrary component included in an embodiment.

Embodiment

A nonvolatile memory device according to the present embodiment will be described with reference to the drawings.

FIG. 1 illustrates the block diagram of the nonvolatile memory device according to the present embodiment. In FIG. 1, a memory cell 1 and a memory cell 2 are each provided at a corresponding one of the crossing positions of word lines WL1 to WL5 and bit lines BL10 to BL1e, BL20 to BL2e, BL30 to BL3e, BL40 to BL4e which are disposed in a lattice pattern, and thus a cross point memory array is formed.

In FIG. 1, a memory cell is illustrated only at each of the cross-points of WL1, WL2, WL3, WL4, WL5, and BL10, BL20, BL30, BL40, and not illustrated at any other cross-point. The memory cell 1 and the memory cell 2 are each includes a variable resistance element 5 and a bidirectional current control element 6 (for example, a bidirectional diode).

A row decoder and word line driver 3 (voltage application unit, hereinafter referred to also as a word line driver 3 as needed) sets a voltage applied to the word lines to a predetermined voltage or to high impedance (HiZ) according to a command from a system controller and data buffer 9 (control unit, hereinafter referred to also as a system controller 9 as needed).

In addition, a column decoder and bit line driver 4 (hereinafter referred to also as a bit line driver 4 as needed) sets a voltage applied to the bit lines to a predetermined voltage or to high impedance (HiZ) according to a command from the system controller 9.

A read circuit 7 selects a bit line out of a plurality of bit lines based on the designation by the system controller 9, measures the potential state and the amount of flowing current of the selected bit line, and outputs information based on the resistance value of the variable resistance element to the system controller.

A host interface 10 performs communication of data and control commands between the nonvolatile memory device according to the present embodiment, and an external device. The system controller and data buffer 9 controls the word line driver 3 and the bit line driver 4 as needed according to a command and/or data from the host interface 10, and writes data to a memory array, or reads data from a memory array.

For example, when the system controller 9 receives a command in read mode from the host interface 10, the read circuit 7 inputs the information based on the resistance value of a desired selection memory cell to the system controller 9. The system controller 9 restores the original digital data and outputs the restored data via the host interface 10.

It is to be noted that FIG. 1 illustrates a memory array having five word lines, however, the number of word lines and the row-to-column ratio are not limited to those in FIG. 1. In addition, the vertical relationship between the bit lines and the word lines, and the connection relationship between the read circuit and the drivers each may be inverted without causing any problem.

[Configuration of Memory Cell]

First, a memory cell used in the nonvolatile memory device according to the present embodiment will be described.

Figure 2:
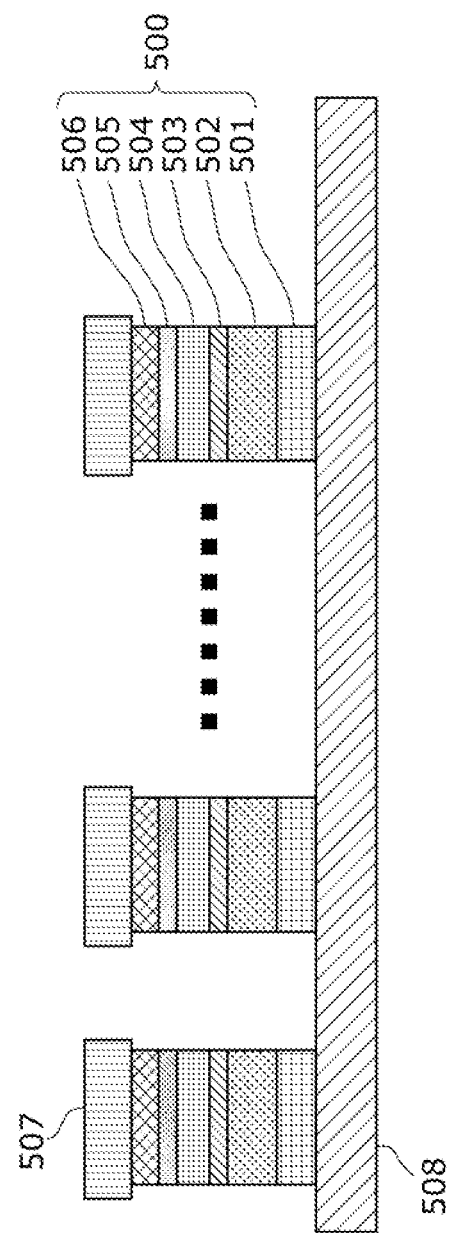
FIG. 2 is an explanatory view illustrating an example of a cross-sectional configuration of a memory cell of the present embodiment.

FIG. 2 is an explanatory view illustrating a cross-sectional configuration of the memory cell according to Embodiment 1.

FIG. 2 illustrates the configuration of a cross-section of the memory array taken along a plane in the direction of the bit lines, and thus a lower wiring 508 is a bit line.

An upper wiring 507 is a word line, and a memory cell 500 is formed at the cross-point of a bit line and a word line.

The memory cell 500 includes a variable resistance element and a bidirectional current control element.

The memory cell 500 illustrated in FIG. 2 is formed in a semiconductor process structure including ordinary transistors, is configured with, for example, a plug layer on a semiconductor substrate.

The memory cell 500 includes a first electrode layer 501 which is a first electrode formed on the lower wiring 508; a bidirectional current control element 502; an intermediate electrode layer 503; and variable resistance layers 504 and 505 interposed between the intermediate electrode layer 503 and a second electrode layer 506. In the present embodiment, the variable resistance layer 504 is a first oxide layer, for example, a first tantalum containing layer with low oxygen content. The variable resistance layer 505 is a second oxide layer, for example, a second tantalum containing layer with high oxygen content, formed on the first tantalum containing layer.

It is to be noted that the relationship between the film thicknesses of the layers, and the vertical relationship between a variable resistance layer and a corresponding bidirectional current control element are not limited to the configuration in FIGS. 1 and 2, and may be modified to an optimal arrangement and geometry as needed according to a semiconductor process. The order of arrangement of the layers in the structure of the variable resistance element may also be changed. In order to improve adhesion between the layers, an adhesion layer may be inserted or a predetermined material may be doped therein.

The material for the first electrode layer 501, the intermediate electrode layer 503, and the second electrode layer 506 includes, for example, Pt (platinum), Ir (iridium), N (tungsten), Cu (copper), Al (aluminum), TiN (titanium nitride), TaN (tantalum nitride), and TiAlN (titanium aluminum nitride).

As the material of the variable resistance layer, for example, an oxygen-deficient transition metal oxide (preferably, oxygen-deficient Ta oxide) is used. The oxygen-deficient transition metal oxide is an oxide that has an oxygen content amount (atomic ratio: ratio of the number of oxygen atoms to the total number of atoms) smaller than that of an oxide having a stoichiometric composition.

For example, when the transition metal element is tantalum (Ta), the stoichiometric composition of oxide is $Ta_2O_5$ and the ratio (O/Ta) of the number of atoms of Ta and O is 2.5. Therefore, the atomic ratio of Ta and O in an oxygen-deficient Ta oxide is greater than 0 and less than 2.5. The type of the transition metal element includes, for example, Fe (iron), Zn (zinc), Cr (chromium), Ni (nickel), Ti (titanium), W, and Hf (hafnium).

In the present embodiment, the oxygen-deficient transition metal oxide is preferably an oxygen-deficient Ta oxide. More preferably, the variable resistance layer 504 is the first tantalum containing layer having a composition expressed by $TaO_x$ (where $0 \le x < 2.5$), and the variable layer 5054 is the second tantalum containing layer having a composition expressed by $TaO_y$ (where $y \le 2.5$). These two layers form a stacked layer structure.

It is to be noted that a layer other than the above-mentioned two layers, for example, a third tantalum containing layer or another transition metal oxide layer may be disposed as needed, and a small amount of impurities may be doped to the above-mentioned two layers. Here, $TaO_x$ as the first tantalum containing layer preferably satisfies $0.8 \le x \le 1.9$, and $TaO_y$ preferably satisfies $x < y$. The thickness of the first tantalum containing layer is preferably 5 nm or greater and 30 nm or less, whereas the thickness of the second tantalum containing layer is preferably 1 nm or greater and 8 nm. The thickness of the second tantalum containing layer is preferably less than the thickness of the first tantalum containing layer.

In the memory cell 500 configured as described above, when a predetermined second voltage is applied to cause current to flow in the direction from the second electrode layer 506 in contact with the variable resistance layer 505 to the intermediate electrode layer 503 in contact with the variable resistance layer 504, the variable resistance element changes to a high resistance state (referred to as HR state or HR) corresponding to the second resistance state. Conversely, when a predetermined first voltage is applied to cause current to flow in the direction from the intermediate electrode layer 503 to the second electrode layer 506, the variable resistance element changes to a low resistance state (referred to as LR state or LR) corresponding to the first resistance state which has a resistance value lower than the resistance value in the second resistance state. That is, the direction of resistance change is determined by how the second oxide layer having high oxygen content and the electrode are arranged for contact.

[Example of Data Write Control]

An example of operation of writing data to the cross point memory array configured as illustrated in FIG. 1 will be described. In the following description, it is defined that digital data of 1 (high level) corresponds to a low resistance state of the memory cell, and digital data of 0 (low level) corresponds to a high resistance state of the memory cell.

As described in the description of FIG. 2, in the present embodiment, because of the structure of the variable resistance element, when the predetermined second voltage is applied to cause current to flow from the upper electrode to the lower electrode, the memory cell changes to a high resistance state. Conversely, when the predetermined first voltage is applied to cause current to flow from the lower electrode to the upper electrode, the memory cell changes to a low resistance state.

For example, when digital data of 1 is written to the memory cells 1 shaded in FIG. 1, the system controller 9 applies a precharge voltage Vpr at an intermediate potential to all the bit lines and word lines, and subsequently, sets the potential of word line WL1 to a potential VwHa which is higher than Vpr voltage. Simultaneously, the system controller 9 sets the potential of bit lines BL10, B120, BL30, BL40 to VwHb which is lower than Vpr voltage, and other unselected word lines and bit lines are terminated with a high impedance (hereinafter denoted by HiZ). In this moment, the difference between VwHa and VwHb is higher than or equal to the second voltage, and thus the memory cells are set in a high resistance state. That is to say, digital data of 1 can be written to the memory cells.

Similarly, when digital data of 0 is written, the system controller 9 applies a precharge voltage Vpr at an intermediate potential to all the bit lines and word lines, and subsequently, sets the potential of word line WL1 to a potential VwLb which is lower than Vpr voltage. Simultaneously, the system controller 9 sets the potential of bit lines BL10, BL20, BL30, BL40 to VwLa which is higher than Vpr voltage, and other unselected word lines and bit lines are terminated with a high impedance (hereinafter denoted by HiZ). In this moment, the difference between VwLa and VwLb is higher than or equal to the first voltage, and thus the memory cells are set in a low resistance state. That is to say, digital data of 0 can be written to the memory cells.

[Example of Data Read Control]

Figure 3:
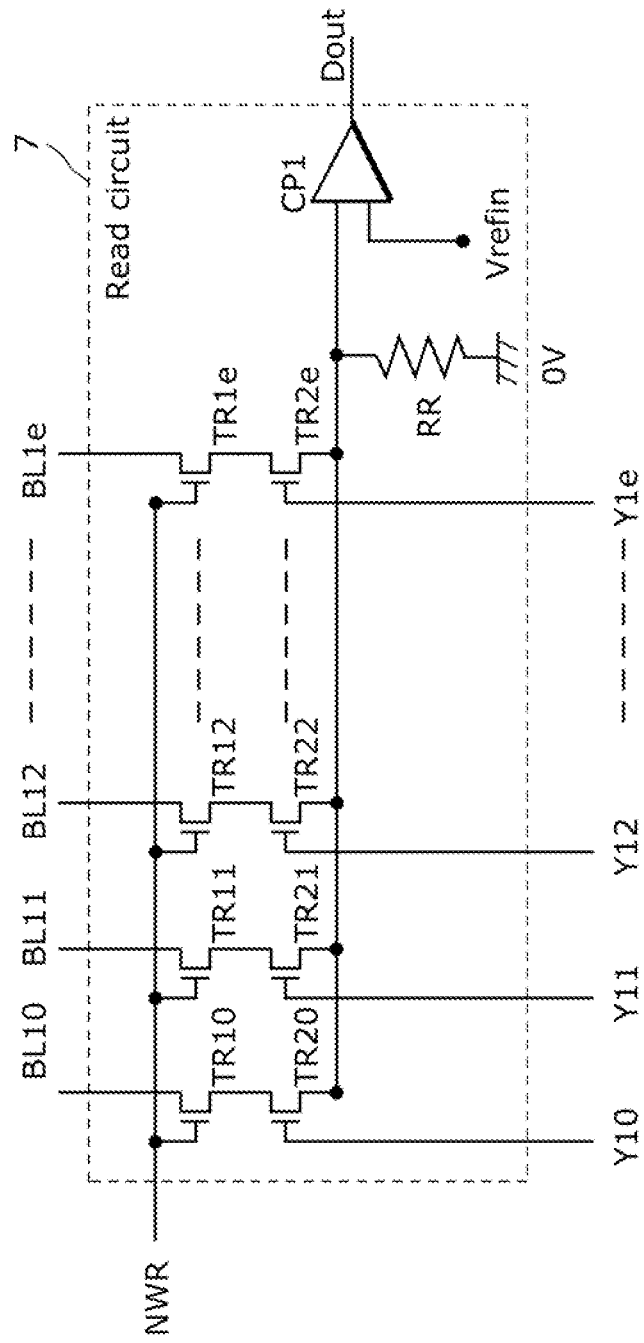
FIG. 3 is a block diagram in the case where the configuration of a conventional read circuit is used in the present embodiment.

FIG. 3 illustrates the detail of the read circuit 7.

The read circuit of FIG. 3 is an example of an ordinary circuit shown in PTL 4, and is referred to as a conventional read circuit 7 in order to distinguish from the read circuit according to the present embodiment. In FIG. 3, TR10 to TR1e and TR20 to TR2e are transistors. In write mode, when NWR is at low level, TR10 to TR1e are all in OFF state and the read circuit 7 is separated from the bit lines of the memory array. Conversely, when NWR is at high level, TR10 to TR1e are all in ON state, and the read circuit 7 is connected to the bit lines of the memory array. Furthermore, control from the system controller 9 causes one of control lines Y10 to Y1e to be set in high level and causes one of TR20 to TR2e to be set in ON state.

Thus, one of the bit lines BL10 to BL1e is inputted to the comparator CP1. Therefore, voltage VRR across a fixed resistor RR changes according to the amount of current flowing through the selected bit line. The VRR serves as an information amount based on the resistance value of the memory cell, and a comparator CP1 compares VRR with the threshold value voltage of Vref1; and when VRR is higher than Vref1, 1 (high level) is outputted to Dout as a low resistance state, and when VRR is lower than Vref1, 0 (low level) is outputted to Dout as a high resistance state.

When an information amount is read based on the resistance value of the memory cells 1 shaded in FIG. 1, all the bit lines and word lines are initially set to 0 V, and read voltage Vr is applied to only the selection word line WL1. Subsequently, the system controller 9 changes NWR of FIG. 3 from low level to high level, sets control line Y10 to high level, and sets control lines Y11 to Y1e to low level, so that a desired bit line is selected. In addition, unselected word lines other than WL1, the word line driver 3 connected to all the bit lines, and the bit line driver 4 are terminated with HiZ.

Thus, the current which flows through a selected memory cell is inputted to the read circuit, and appears as a potential across the fixed resistor RR of each conventional read circuit 7, the potential serving as an information amount based on the resistance value of the selected memory cell, and the data stored in the selected memory cell is read.

It is to be noted that the application method and application step for a voltage to the word lines or bit lines in the write control and read control are not limited to those as described above.

[Problem in Use of Conventional Read Circuit]

The variable resistance element using a tantalum oxide, illustrated in the present embodiment is insulated in the initial state after manufacture. Therefore, in order to cause the variable resistance element to be switchable between a high resistance state and a low resistance state by electrical stress, it is necessary to perform forming process for creating a filament path in the variable resistance element by first applying a predetermined voltage to the variable resistance element. Because the number of voltage application to achieve the forming is varied from one target cell (variable resistance element) to another due to a variation even in the same array, it is determined whether or not the forming process has been completed as already described using PTL 1. Specifically, after the forming voltage is applied, the resistance value information of the target cell is measured, and reading operation of the resistance value information is repeated until the read resistance value information falls within a predetermined range of low resistance state.

For example, a first exemplary forming process, in which forming process is performed using the conventional read circuit 7 of FIG. 3, will be described. In this case VFref voltage, which serves as a threshold value at the time of forming, is inputted to Vrefin terminal of FIG. 3, and when VRR voltage becomes higher than VFref voltage and the memory cell has a resistance value lower than a predetermined resistance value, it is determined that the forming process is completed, and the process proceeds to the next address cell. When the forming process for each of the memory cells at all target addresses is completed, the process is terminated.

Figure 4:
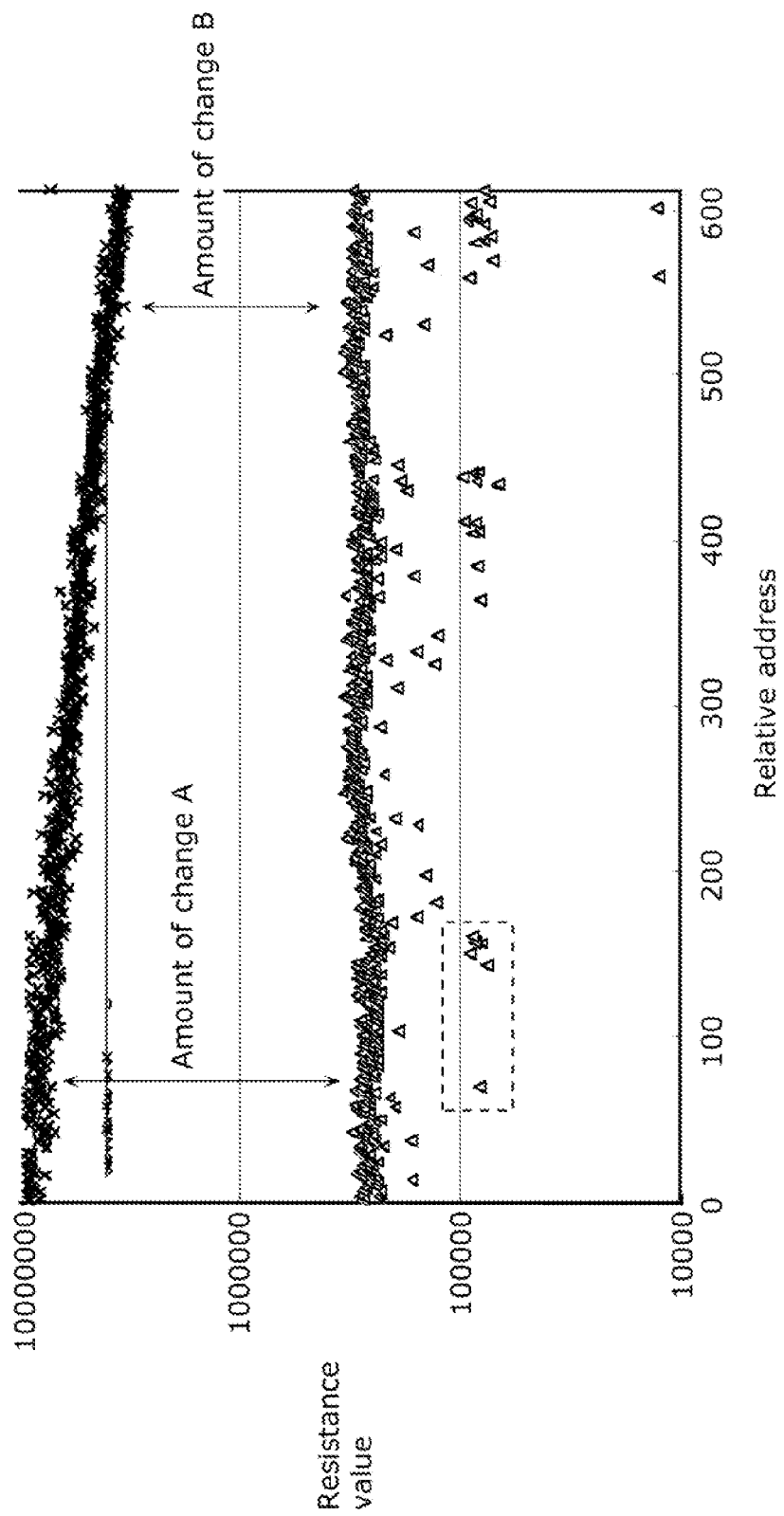
FIG. 4 is an explanatory view illustrating a first failure when the conventional read circuit is used.

Here, it is assumed that when read voltage Vr is applied to a single memory cell and the resistance value of the memory cell is 300 kΩ, the current of $I_{300k}$ flows, and when $I_{300k}$ flows through the fixed resistor RR of FIG. 3, the voltage across the fixed resistor RR is $VRR_{300k}$. FIG. 4 illustrates the change of the resistance value of the memory cell in each address when the first exemplary forming process is performed by applying $VRR_{300k}$ voltage to Vrefin terminal.

In FIG. 4, the horizontal axis indicates the relative address of a memory cell and the vertical axis indicates the resistance value of the memory cell. In addition, x symbol indicates the initial resistance value immediately before a forming process for each memory cell starts, and Δ symbol indicates the resistance value of each memory cell immediately after the forming process is completed with the resistance value exceeding the aforementioned threshold value. Each resistance value is determined by measuring VRR voltage using a common tester device different from the read circuit 7.

It is already checked that all the memory cells each have an initial resistance of approximately 10 MΩ. However, it can be seen in FIG. 4 that the initial resistance value immediately before the forming process for each memory cell decreases as the number of cells which have undergone the forming process increases. This is because the variable resistance element, which is originally an electrical insulator, becomes electrically conductive due to the forming process, and thus the leakage current of the memory array gradually increases and the resistance value is observed to be seemingly low.

On the other hand, it can be seen that the resistance values indicated by Δ symbol immediately after the forming are mostly distributed around 300 kΩ uniformly. That is, the resistance value as a target for the forming process is fixed at 300 kΩ irrespective of the level of the leakage current, and thus, at an address in the first half addresses with less leakage current, application of voltage to the memory cell is repeated so as to cause significant decrease in the resistance as indicated by change amount A.

On the other hand, at an address in the second half addresses with more leakage current, a small change amount is sufficient as indicated by change amount A, and thus the forming is completed using less electrical stress compared with the electrical stress used in the first half addresses. That is, the state of a memory cell after the forming is varied from one memory cell to another according to the level of leakage current. It can be seen that the plotted memory cells in the portion surrounded by a dashed line in FIG. 4 each have an extremely low resistance. This is because a diode as a selection element is broken down and in a nearly short-circuit condition.

In this manner, when the threshold value for the forming is 300 kΩ, excessive forming is performed in an initial process where the leakage current is small and the change amount is large, and thus breakdown of a selection element and/or a failure of reducing to a lower resistance level than is necessary may occur.

The second half addresses in FIG. 4 also include some memory cells which have a reduced resistance value comparable to the resistance value of the memory cells surrounded by the dashed line. However, in contrast to the memory cells surrounded by the dashed line, those some memory cells have not necessarily been broken down. When a normal memory cell and a memory cell with a broken-down selection element are placed on the same word line, leakage current is significantly increased and thus the apparent resistance of a normal memory cell is measured to be extremely low.

Figure 5:
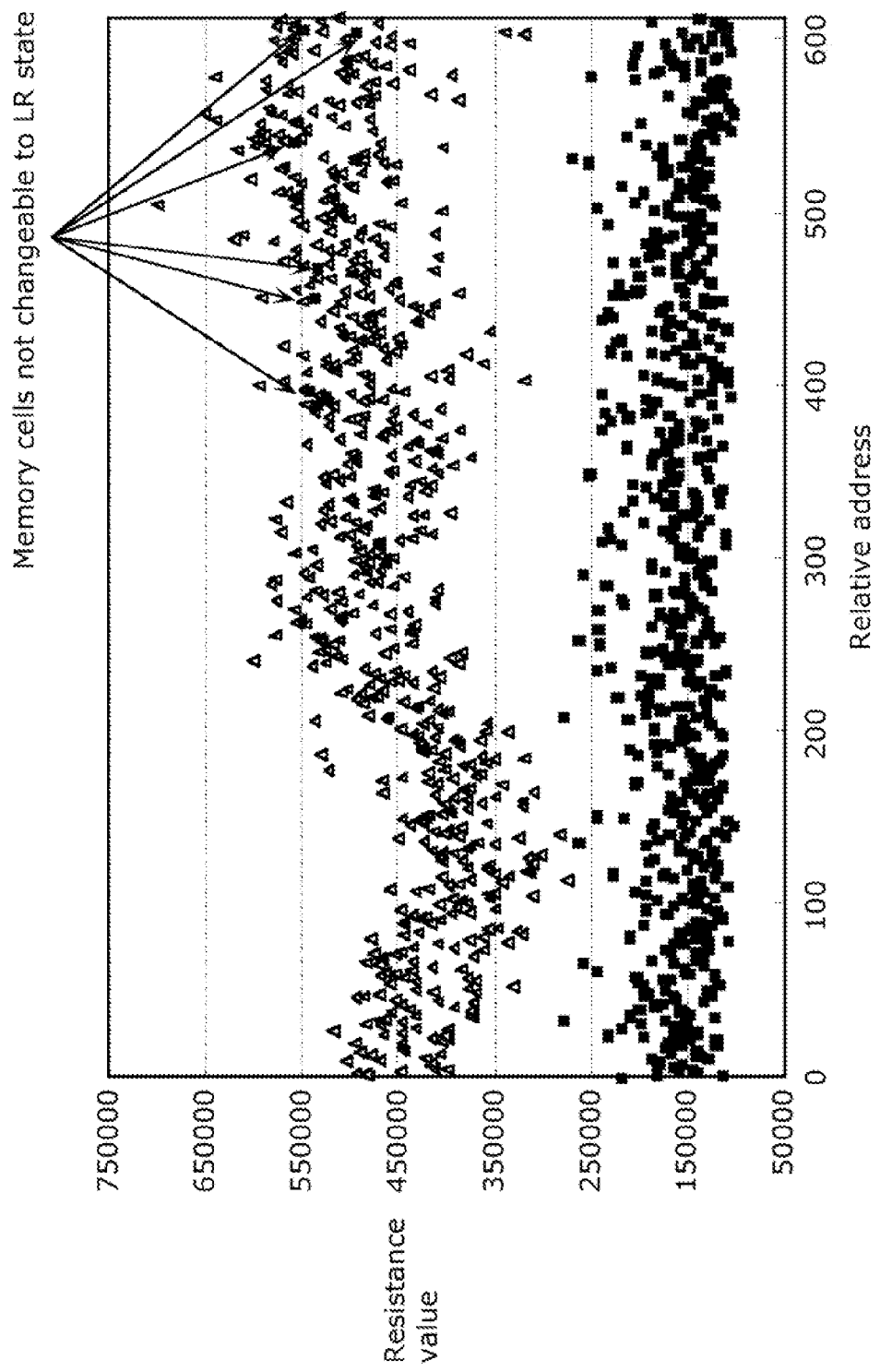
FIG. 5 is an explanatory view illustrating a second failure when the conventional read circuit is used.

Next, FIG. 5 illustrates the change of the resistance value of the memory cell at each address when HR state and LR state are reversibly changed after the first exemplary forming process is performed, in which voltage $VRR_{500k}$ having a threshold value of 500 kΩ for forming is applied to Vrefin terminal. The relationship between the vertical axis and the horizontal axis of FIG. 5 is the same as that of FIG. 4, and Δ symbol indicates HR state of each memory cell and black square symbol indicates LR state. A failure of performing an excessive forming to break a diode has been eliminated by increasing a threshold value from 300 kΩ to 500 kΩ.

However, it can be seen from observation of the level of the resistance value in HR state indicated by Δ that the forming is performed intensely and the level of the resistance value is low in the first half address region where the leakage current is small, whereas the forming is performed less intensely in the second half address region, and thus the level of the resistance value is high. Furthermore, in the second half address region where only less intense forming is performed, operationally failed cells, which cannot change to LR state, are found here and there as indicated by arrows. That is, in the case of a cross point nonvolatile memory in which leakage current increases with the number of memory cells that have undergone the forming process, normal forming cannot be performed with a single fixed threshold value for the forming.

[First Example of Read Circuit]

The nonvolatile memory device according to the embodiment solves the above-mentioned newly found problems.

Figure 6:
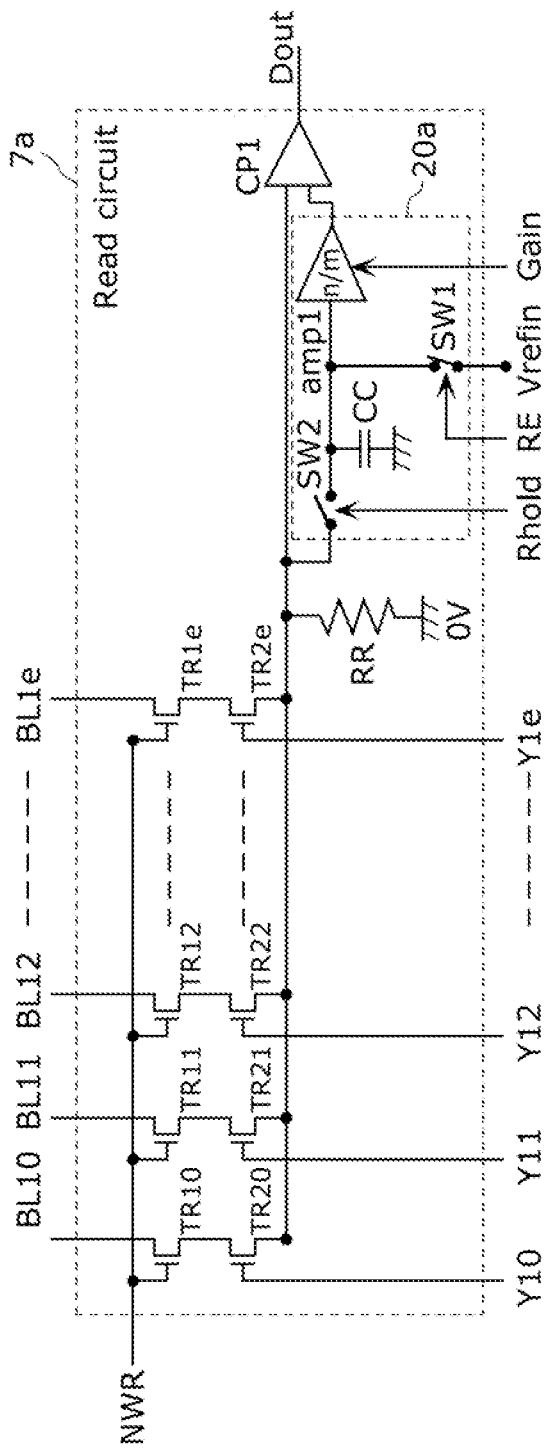
FIG. 6 is a block diagram illustrating the configuration of a first read circuit in the present embodiment.

FIG. 6 is a first read circuit example according to the present embodiment.

The components other than the read circuit, that is the memory cell, the system controller 9 (control unit), the word line driver 3 (voltage application unit), and the bit line driver 4 are the same as those described with reference to FIGS. 1, 2, and 3. Thus, a first read circuit 7a will be described in the following.

Any component which is labeled with the same symbol in the read circuit 7a of FIG. 6 and the read circuit 7 of FIG. 3 has the same function. In the read circuit 7a, a resistance value information hold circuit 20a has been added to the configuration of FIG. 3.

The resistance value information hold circuit 20a includes SW1, SW2, a capacitor CC, and amp1.

In FIG. 6, SW1 is turned on when a signal RE is "H" and turned off when the signal RE is "L".

Similarly, SW2 is turned on when a signal Rhold is "H", and turned off when the signal Rhold is "L".

A capacitor CC (memory unit) is a capacitor that has a predetermined capacity, and, for example, a MOS capacitor is used in a semiconductor process.

Amp1 (arithmetic unit) is an amplifier that amplifies an input voltage n/m (n>m) times and outputs the amplified voltage. The amplification ratio of the amp1 can be set via Gain terminal. When data is read in a normal operation, "L" is inputted to Rhold, "H" is inputted to RE, SW2 is turned OFF, SW1 turned ON, and thus an input voltage from Vrefin is inputted via amp1 to CP1 as a threshold value voltage. In the above process, the setting is n=m=1 and the voltage of Vrefin is directly inputted based on control by the system controller 9. Consequently, the read circuit 7a in normal operation has the same operation as the circuit operation in FIG. 3.

Next, the operation of the read circuit 7a when performing a forming will be described. The states of NWR and the control lines Y10 to Y1e are set based on control by the system controller 9, and the method of selecting a bit line to be read is the same as that of the circuit of FIG. 3, thus a description is omitted.

First, a memory cell for the forming is selected, and the initial resistance value information of the selected memory cell is acquired before a forming voltage is applied. RE terminal is set at low level, SW1 is set OFF, and the selected cell is thereby set in read state, and in the condition that a read voltage is generated at both ends of the fixed resistor RR (reading unit), Rhold terminal is caused to change low level→high level→low level, and SW2 is caused to change OFF→ON→OFF.

Consequently, a voltage equivalent to the potential at both ends of the fixed resistor RR is charged to the capacitor CC. That is, in the first read circuit example, the resistance value information is the voltage charged to the capacitor CC, and the capacitor CC stores resistance value information as the initial resistance value information, the resistance value information (the potential at the both ends of the fixed resistor RR) being read by the reading unit (fixed resistor RR) from the memory cell.

It is to be noted that charging the capacitor CC takes a predetermined time, and the time period in which SW2 is ON described above is sufficiently longer than the time necessary for the charging. That is to say, the information amount based on the initial resistance of the selected memory cell is held in the voltage across the capacitor CC. This voltage is multiplied by n/m and is used as a threshold value to determine completion of the forming. It is to be noted that although the electric charge charged in the capacitor CC is gradually discharged, the capacitor CC is designed to maintain a desired level until the forming is completed.

The technique for the forming is the same as described with reference to FIG. 3. That is, an absolutely constant resistance value is not used as a threshold value, but the threshold value is defined by the resistance value information which is obtained by multiplying an initial resistance value by a predetermined ratio by amp1, the initial resistance value information being measured for each cell, and it is determined whether or not the forming is completed based on thus defined threshold value. That is the system controller 9 (control unit) controls the word line driver 3 (voltage application unit) so as to cause the word line driver 3 to repeat application of the forming voltage until the resistance value information on the memory cell read by the read circuit 7a becomes lower than the resistance value based on the initial resistance value information.

It is to be noted that in the read circuit 7a, the threshold value is obtained by multiplying the initial resistance value information by n/m by amp1, however, the method of setting a threshold value is not limited to this. A threshold value may be set based on the initial resistance value information. For example, when the array size is large, the leakage current increases according to an increasing number of bits which have undergone the forming, and thus when the value of n/m is used as a fixed value, a desired determination threshold value cannot be achieved. In this case, it is desirable to perform control such that the above-mentioned value of n/m is changed using a predetermined ratio as needed according to the progress of the forming in the array.

Figure 7:
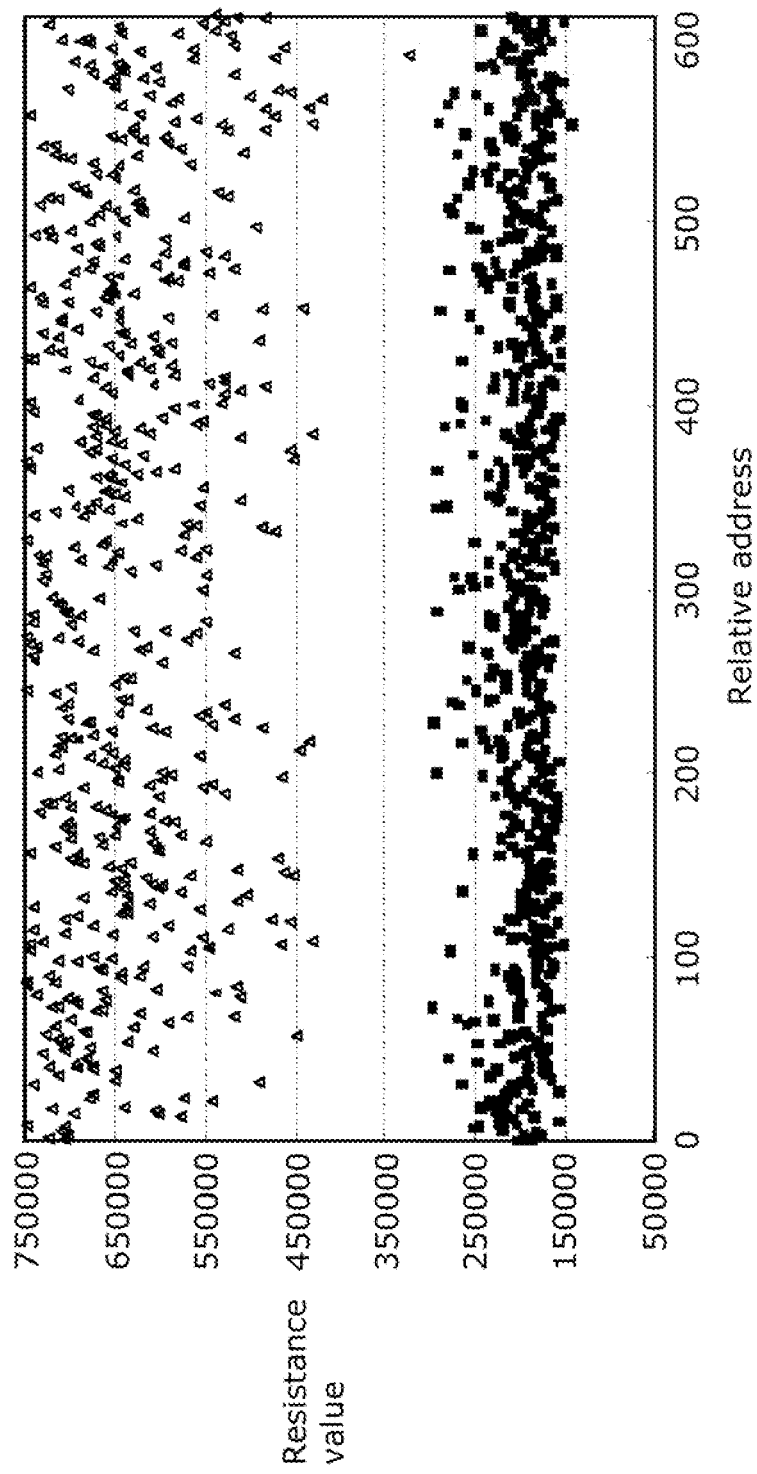
FIG. 7 is an explanatory view illustrating an improvement effect achieved by the read circuit in the present embodiment.

FIG. 7 illustrates the result of experiment: the forming for each memory cell is completed using the first read circuit, then each memory cell is caused to change to HR state or LR state.

Similarly to FIG. 5, in FIG. 7, each Δ symbol indicates HR state of each memory cell and each black square symbol indicates LR state. HR state and LR state are favorably separated without uneven level of HR state as indicated in FIG. 5. A failed memory cell which cannot change to LR state is not observed, and all the memory cells have achieved favorable resistance change.

As described above, even when the apparent resistance values decrease due to an increase of the number of memory cells which have undergone the forming and an accompanying increase of the leakage current, the resistance value immediately before performing the forming for each memory cell is stored, and the threshold value obtained by multiplying the stored resistance value by a predetermined ratio is used as a determination threshold value, and the threshold value is thereby automatically updated optimally and proper forming can be performed.

[Second Read Circuit Example]

Next, a second read circuit example according to the present embodiment will be described.

The components other than the read circuit, that is, the memory cell, the system controller 9 (control unit), the word line driver 3 (voltage application unit), and the bit line driver 4 are the same as those described with reference to FIGS. 1, 2, and 3. Thus, the second read circuit will be described in the following.

Figure 8:
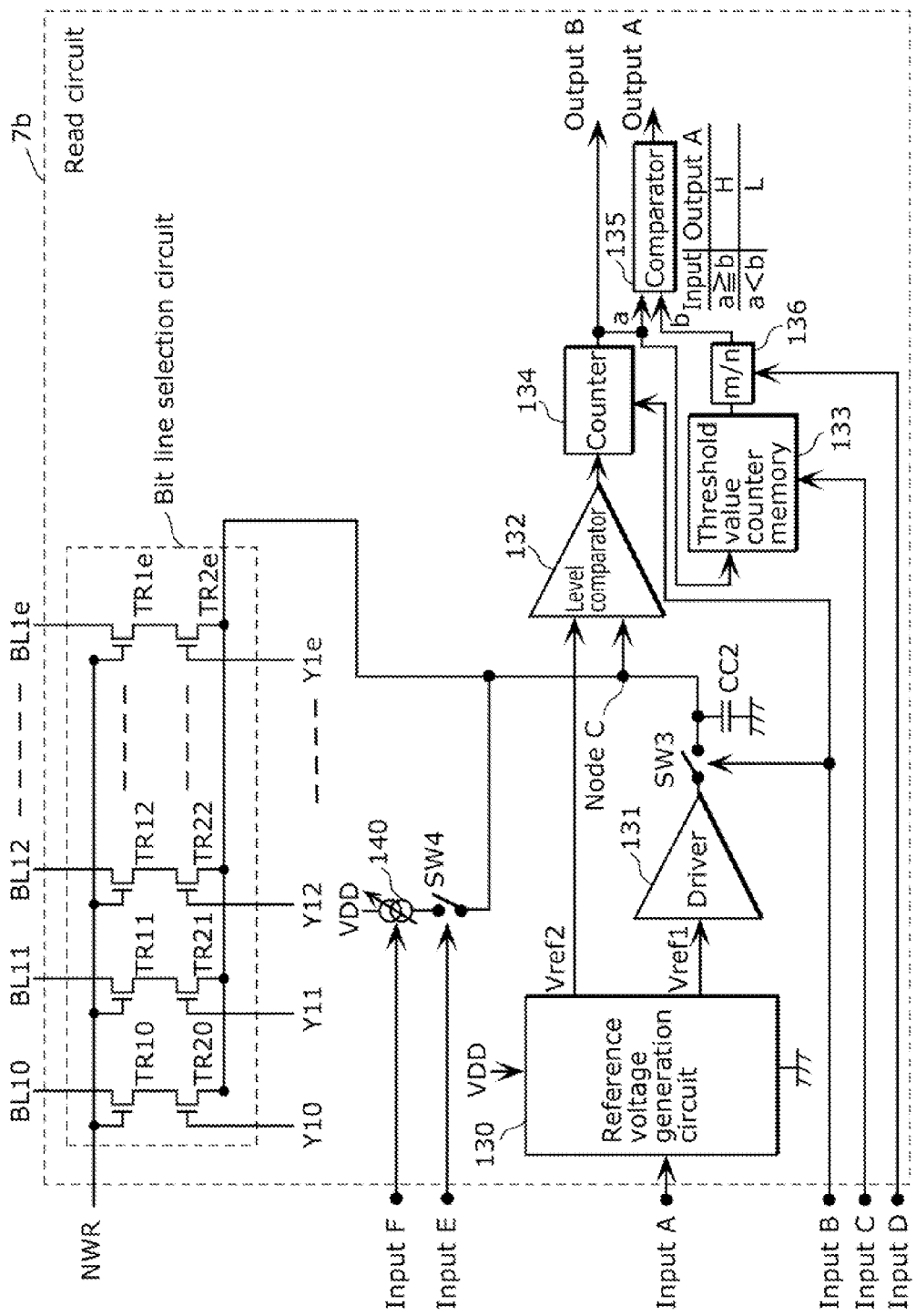
FIG. 8 is a block diagram illustrating the configuration of a second read circuit in the present embodiment.

FIG. 8 is a block diagram illustrating the second read circuit.

The second read circuit 7b includes a bit line selection circuit, a counter circuit (reading unit), a threshold value counter memory 133 (latch circuit), an m/n calculation unit 136 (digital calculation circuit), a comparator 135, and a constant current source 140 (constant current drive circuit).

In FIG. 8, the bit line selection circuit surrounded by a dashed line has the same function as that of the bit line selection circuit used for the above-described read circuit 7 illustrated in FIG. 3. Thus, a description of the bit line selection circuit is omitted.

The counter circuit (reading unit) includes a reference voltage generation circuit 130, SW3, a driver 131, a capacitor CC2, a level comparator 132, and a counter 134.

The reference voltage generation circuit 130 is a circuit which outputs a predetermined reference voltage based on control from the system controller 9, the control being inputted from input A. The reference voltage generation circuit 130 generates a plurality of predetermined voltage levels, for example, by dividing the potential difference between a supply voltage VDD and a ground level using a ladder resistor or the like. The reference voltage generation circuit 130 outputs a read voltage Vref1 and a reference voltage Vref2 by selecting two voltage levels from the generated voltage levels using a semiconductor switching element or the like.

It is to be noted that many circuits have been previously disclosed as a circuit for generating a reference voltage, and such a circuit may be used. That is, the reference voltage generation circuit 130 is not limited to the circuit configuration described above.

It is to be noted that the read voltage Vref1 is higher than the reference voltage Vref2. This can be easily inferred from the circuit design in the following stage.

SW3 is turned ON (conducting) or turned OFF nonconducting) according to a switch control signal inputted to input B from the system controller 9, SW3 is turned ON when a switch control signal is 'H', and at this point, a reference voltage Vref1 outputted by the reference voltage generation circuit 130 is outputted to node C via the driver 131. SW3 is turned OFF when a switch control signal is 'L', and at this point, an input state to the node C from the reference voltage generation circuit 130 is HiZ (high impedance) state.

The driver 131 is a buffer amplifier. It is to be noted that the voltage outputted by the driver 131 is actually somewhat different from the reference voltage Vref1 outputted by the reference voltage generation circuit 130 because of a voltage drop of transistors and wiring included in the circuits of the driver 131. However, for the sake of simplification of description, it is assumed that no voltage drop occurs.

The node C is connected to a memory cell selected from the memory array illustrated in FIG. 1. In the read circuit 7a of FIG. 3, the read voltage Vr is applied to the selection word line WL1 of FIG. 1 at the time of reading. In the read circuit 7b, however, the selection word line WL1 is connected to the ground at the time of reading. That is, one end not connected to the node C of the memory cell is connected to the ground. Therefore, in the second read circuit, the direction of current which flows through a memory cell at the time of reading is opposite to the direction in the read circuit 7 of FIG. 3.

In addition, the capacitor CC2 is provided between the node C and the ground. That is, at the time of a reading, the memory cell and the capacitor CC2 are connected in parallel.

The capacitor CC2 (capacitative element) may be substituted by a capacitor of wiring or a capacitor of transistor, or a capacitative element such as a MOS capacitor may be added in the design of a device.

The level comparator 132 compares the reference voltage Vref2 outputted by the reference voltage generation circuit 130 with the potential at the node C. When the potential at the node C is higher than the reference voltage Vref2, the level comparator 132 outputs otherwise the level comparator 132 outputs 'H'.

The counter 134 performs count-up according to the cycle of a clock (not illustrated) inputted to the counter 134 in a time period when the level comparator 132 outputs signal 'L', and outputs a count tri value.

The counter 134 receives an input of a switch control signal from the input B. The counter 134 performs the above-mentioned count-up in a time period when the switch control signal from the input B is 'L'. The count value is set to zero in a time period when the switch control signal from the input B is 'H'.

That is, only when the control signal from the input B is 'L' and the input from the level comparator 132 is 'L', the counter 134 performs counting according to the cycle of the clock. It is to be noted that the counter 134 has a predetermined upper limit so that overflow of the count value does not occur.

In the following, a method of counting up a count value will be described.

After the predetermined read voltage Vref1 is applied via the driver 131 to both ends of the memory cell connected in parallel to the capacitor CC2 by the reference voltage generation circuit 130, the counter 134 counts the discharge time until the voltage (voltage at the node C) between the both ends of the memory cell decreases to the predetermined reference voltage Vref2 using a predetermined cycle.

In the above process, the lower the resistance value of the memory cell, the more quickly the electric charge in the capacitor CC2 is discharged and the potential at the node C decreases, and the shorter the electric discharge time is. Similarly, the greater the resistance value of the memory cell, the more slowly the electric charge in the capacitor CC2 is discharged and the potential at the node C decreases, and the longer the electric discharge time is.

Figure 9:
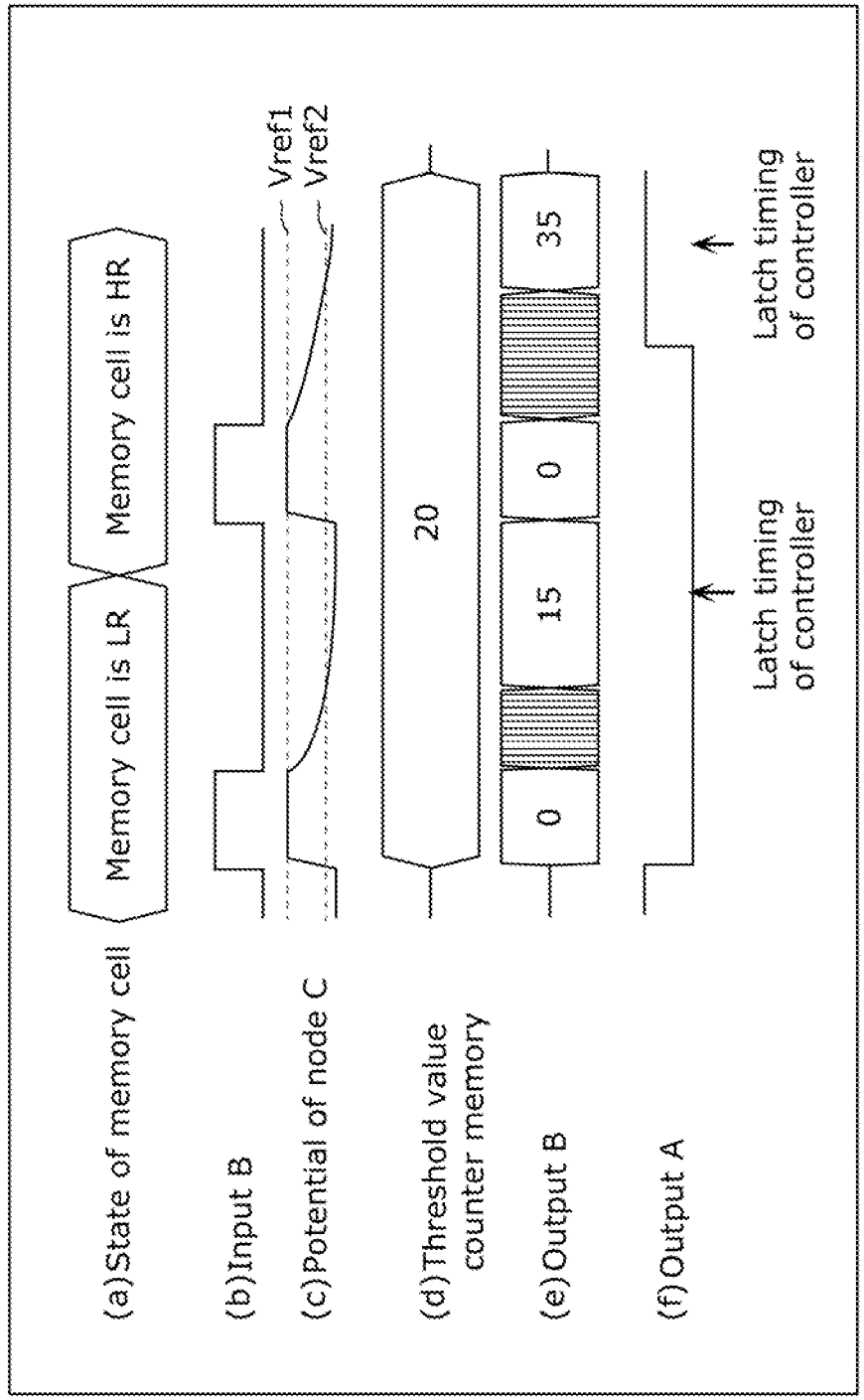
FIG. 9 is a timing chart illustrating the operation of the second read circuit in the present embodiment.

FIG. 9 is a diagram illustrating the relationship between the resistance of a memory cell, the electric discharge time, and the count value.

As illustrated in a) of FIG. 9, the memory cell is in a low resistance state (LR state) in the first half of the diagram, and in a high resistance state (HR state) in the second half of the diagram.

In (b) of FIG. 9, it is illustrated that in each resistance state of the memory cell, a switch control signal 'H' is inputted to the input B, and the read voltage Vref1 is applied to the node C during a time period when 'H' is inputted. That is, the capacitor CC2 is charged with the read voltage Vref1.

When the input B changes from 'H' to 'L' in (b) of FIG. 9, the switch circuit SW3 is set to OFF and the node C is separated from the driver 131 to be in HiZ state. Therefore, as illustrated in (c) of FIG. 9, the electric charge in the capacitor CC2 is gradually discharged. As illustrated in FIG. 9, when the memory cell is in LR state, the electric discharge time is short; and when the memory cell is in HR state, the electric discharge time is long.

The level comparator 132 compares the reference voltage Vref2 outputted by the reference voltage generation circuit 130 with the above-mentioned potential at the node C. When the potential at the node C is higher than Vref2, the level comparator 132 outputs to the counter 134; otherwise the level comparator 132 outputs 'H' to the counter 134.

The counter 134 counts up a count value according to the cycle of the clock in a time period when the level comparator 132 outputs signal 'L'. The count value serves as an initial count value (initial resistance value information). For example, as illustrated in (e) of FIG. 9, the count-up starts immediately after the input B changes to 'L' in (b) of FIG. 9, and when the memory cell is in LR state, the count-up stops at a count of 15, and the count value at the moment is held. Similarly, when the memory cell is in HR state, the count-up stops at err a count of 35, and the count value at the moment is held.

In this manner, in the second read circuit 7b, the count value is used as resistance value information based on the fact that the electric discharge time varies with the resistance values of the memory cells.

The threshold value counter memory 133 (latch circuit) stores an initial count value and outputs the initial count value to the m/n calculation unit 136 based on the control signal inputted to the input C by the system controller 9, the initial count value being resistance value information indicating the resistance value of the memory cell before the forming voltage is applied.

At the time of normal read operation other than the forming operation, the threshold value counter memory 133 sets and outputs a count value (for example, 20) based on a control signal inputted to the input C as illustrated in (d) of FIG. 9 described below, the count value serving as a threshold value for determining a high resistance state and a low resistance state of the memory cell.

It is to be noted that the value of the threshold value counter memory 133 illustrated in FIG. 9 and the holding value of the counter 134 are not limited to these values. These values are varied with the count clock frequency of the counter 134, the capacitative value of the capacitor CC2, the values of the read voltage Vref1 and the reference voltage Vref2, and a variation in the resistance values of the memory cells.

The m/n calculation unit 136 multiplies an initial count value by m/n and outputs the multiplied count value based on the control signal inputted to input D by the system controller 9, the initial count value being outputted by the threshold value counter memory 133.

At the time of normal read operation other than the forming operation, the m/n calculation unit 136 sets m=n=1 based on the control signal inputted to input D by the system controller 9. Thus, the count value outputted from the threshold value counter memory 133 is outputted as it is.

In the read circuit 7b, the threshold value is set as the product of initial resistance value information and m/n, the initial resistance value information being indicated by the initial count value outputted by the threshold value counter memory 133. However, the method of setting the threshold value is not limited to this. The threshold value may be set based on the initial resistance value information. For example, when the array size is large, the leakage current increases according to the number of bits which have undergone the forming, and thus when the value of m/n is used as a fixed, value, a desired determination threshold value cannot be achieved. In this case, it is desirable to perform control such that the above-mentioned value of m/n is changed using a predetermined ratio as needed according to the progress of the forming in the array.

The comparator 135 compares the count value outputted by the counter 134 with the count value outputted by the m/n calculation unit 136, and outputs a result of the comparison to the output A. Assuming that the count value outputted by the counter 134 is a, and the count value outputted by the m/n calculation unit 136 is b. When a≥b, the comparator 135 outputs 'H' to the output A; and when a<b, the comparator 135 outputs 'L' to the output A.

The constant current source 140 is connected to the node C via SW4, and can supply current to the node C when SW4 is in ON state based on control from the system controller 9. The constant current source 140 can change a current value according to a control signal of input F from the system controller 9. In this manner, the above-described electric discharge time can be increased by flowing a constant current from the constant current source through a selected cell, and the resolution of count value when the resistance value of the variable resistance element is reduced can be improved. The detail of the relationship with the resistance value information when the constant current source 140 is used will be described below. The constant current source 140 includes, for example, a Pch-MOSFET and a current mirror circuit. SW4 is turned ON or OFF based on control from the system controller 9. Specifically, when the switch control signal is 'H', SW4 is turned ON; and when the switch control signal is 'L', SW4 is turned OFF. The constant current source 140 can change the amount of flowing current to 1st to Nth levels by control from the input F. That is, the constant current source 140 can change a predetermined current flowing through the memory cell to 0th to Nth levels including the 0th level in which no current flows, by combining ON and OFF of SW4 based on control of the system controller 9.

Next, the forming operation according to the readout circuitry 7b will be described.

Figure 10:
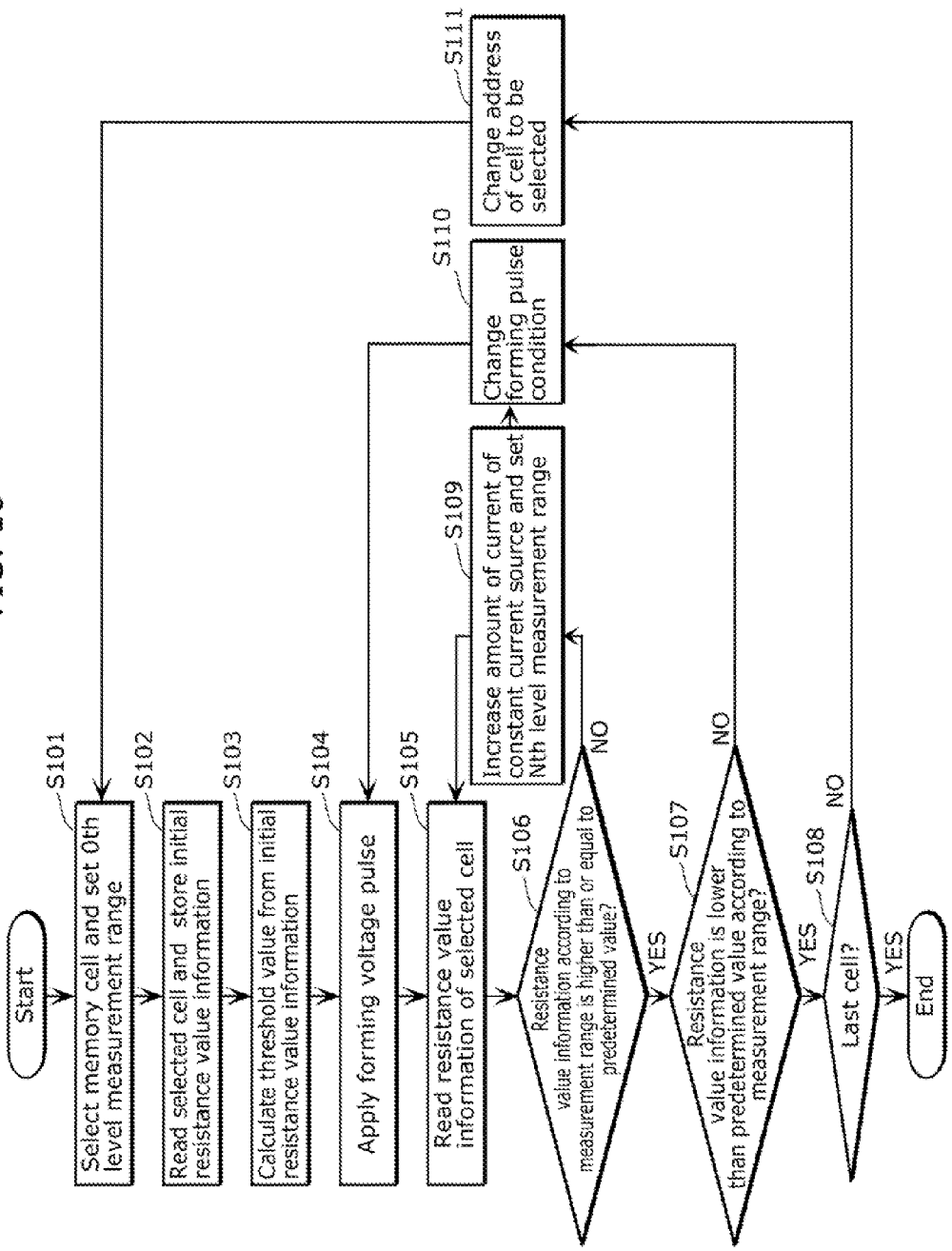
FIG. 10 is a flow chart of the operation of the second read circuit in the present embodiment.

FIG. 10 is a flow chart of the forming operation according to the readout circuitry 7b.

First, the system controller 9 sets the measurement range for obtaining resistance value information to the 0th level, and selects a memory cell (S101).

In the entire configuration illustrated in FIG. 1, the system controller 9 first connects all the bit lines BL10 to BL40 and the word lines WL1 to WL5 to the ground (0V).

Subsequently, the system controller 9 sets NWR in FIG. 8 from low level to high level to turn ON TR10 to TR1e. The system controller 9 further turns ON a corresponding transistor of TR20 to TR2e according to a control line Y corresponding to the bit line connected to the memory cell (selection memory cell) to be selected. Specifically, for example, when a memory cell connected to the bit line BL10 is selected, the system controller 9 sets the control line Y10 from low level to high level to turn ON TR20. The system controller 9 maintains the control line Y11 to Y1e at low level. Thus, the memory cell connected to the bit line BL10 is selected.

Next, the system controller 9 stores the initial resistance value information (initial count value) of the selection memory cell (S102). The initial resistance value information is information indicating the resistance value of the selection memory cell before the forming voltage is applied to the selection memory cell, and is expressed by a count value counted by the counter 134 in the read circuit 7b.

In the entire configuration illustrated in FIG. 1, the system controller 9 first separates all the word lines WL2 to WL5 from the word line driver 3 and terminates the word lines WL2 to WL5 with HiZ, the word lines WL2 to WL5 being other than the word line (selection word line) WL1 connected to the selection memory cell. Similarly, the system controller 9 separates all the bit lines BL10 to BL40 from the bit line driver 4 and terminates the bit lines BL10 to BL40 with HiZ.

Subsequently, the system controller 9 connects the selection word line WL1 to the ground by the word line driver 3. Thus, the selection memory cell and the capacitor CC2 are connected in parallel.

Next, the system controller 9 outputs a switch control signal 'H' to the input B to turn ON SW3. The system controller 9 outputs a control signal to the input A. Thus, the reference voltage generation circuit 130 outputs the voltage Vref1 to the node C via the driver 131 based on control of the system controller 9. That is, the predetermined read voltage Vref1 is applied to both ends of the memory cell (capacitor CC2), and the capacitor CC2 is charged by the read voltage Vref1.

Subsequently, the system controller 9 outputs a switch control signal 'L' to the input B to turn OFF SW3. Thus, the node C is separated from the driver 131 and set in HiZ state. For this reason, in the electric charge charged in the capacitor CC2 by the read voltage Vref1 is discharged at a time constant determined by the capacitative value of the capacitor CC2 and the resistance value of the memory cell connected in parallel to the capacitor CC2, and the potential at the node C gradually decreases from the read voltage Vref1.

The level comparator 132 compares the reference voltage Vref2 outputted by the reference voltage generation circuit 130 with the above-mentioned potential at the node C. When the potential at the node C is higher than Vref2, the level comparator 132 outputs 'L' to the counter 134, otherwise the level comparator 132 outputs 'H' to the counter 134.

The counter 134 counts up a count value according to the cycle of the clock in a time period when the level comparator 132 outputs signal 'L'.

Thus measured initial count value is stored in the threshold value counter memory 133, the initial count value indicating the state of the resistance value of the memory cell before the forming voltage is applied.

Next, the system controller 9 determines a forming threshold value from the initial resistance value information (initial count value), the forming threshold value being a threshold value indicating the resistance value based on the initial resistance value information (S103).

Specifically, the forming threshold value is the above-mentioned initial count multiplied by m/n, the multiplication being performed by the m/n calculation unit 136, the initial count value being outputted by the threshold value counter memory 133. The initial count value is a value to be stored in the measurement range of the 0th level, and thus the conversion ratio is varied with the N levels of measurement ranges. That is, the value of m/n is a threshold value for which the conversion ratio has been adjusted according to the measurement range.

Next, the system controller 9 applies the forming voltage to a selected memory cell (S104). Specifically, the system controller 9 applies the forming voltage to the selection word line WL1 by the word line driver 3.

Subsequently, the system controller 9 reads the resistance value information on the memory cell to which the forming voltage has been applied in step S104 (S105), and compares the resistance value information with the forming threshold value using the comparator 135 (S106). Specifically, as described in step S102, the system controller 9 connects the selection word line WL1 to the ground by the word line driver 3, and determines a count value using the electric discharge time after the read voltage is applied to a circuit in which the selection memory cell and the capacitor CC2 are connected in parallel, the count value indicating the resistance value of the selection memory cell.

When the resistance value information (count value) is less a predetermined value for the level of the measurement range (No in S106), the system controller 9 determines that measurement accuracy is insufficient and increases the level of the current amount of the constant current source by one (S109), and reads again the resistance value information of the selected cell as in step S105.

When the resistance value information is greater than or equal to a predetermined value for the level of the measurement range (Yes in S106), the system controller 9 determines that the accuracy of measured value is in accordance with a desired specification, and the flow proceeds to next step S107. When the above-mentioned resistance value information (count value) is greater than or equal to the forming threshold value (No in S107), the forming voltage is again applied to the selected memory cell (S104).

At this point, the system controller 9 may change conditions (such as a voltage amplitude, a pulse width, and a number of repeated applications) for a forming pulse (S110). The system controller 9 preferably takes control of increasing or decreasing the voltage amplitude, the pulse width, and the number of repeated applications, for example, subsequent to step S109 according to the progress of measurement range.

As a specific example, when the resistance measurement range remains at the 0th level, the system controller 9 determines that the forming has not progressed, and performs an operation to increase the intensity of the forming process such as "increasing the voltage amplitude", "expanding the voltage pulse width", and/or "increasing the number of repeated applications of a voltage pulse".

Conversely, when the resistance measurement range is for a low resistance measurement, the system controller 9 determines that the forming has progressed, and performs an operation to decrease the intensity of the forming process such as "decreasing the voltage amplitude", "reducing the voltage pulse width", and/or "decreasing the number of repeated applications of a voltage pulse".

It is to be noted that when the count value is greater than or equal to the forming threshold value specifically refers to the case where is outputted to the output A by the comparator 135. That is, the above case indicates that the count value of the selection memory cell outputted by the counter 134 is greater than or equal to the initial count value outputted by the m/n calculation unit 136.

When the resistance value information (count value) is lower than the forming threshold value (Yes in S107), the system controller 9 terminates the forming of the selected memory cell, and when the selected memory cell is the last cell, the system controller 9 terminates the forming process for the entire device (Yes in S108).

When the selected memory cell is not the last cell (No in S108), the system controller 9 changes the address of a selection cell (S111) and starts the forming process again from Step S101.

It is to be noted that when the count value is less than the forming threshold value specifically refers to the case where 'L' is outputted to the output A by the comparator 135. That is, the above case indicates that the count value of the selection memory cell outputted by the counter 134 is less than the initial count value outputted by the m/n calculation unit 136.

That is to say, the system controller 9 controls the word line driver 3 so as to cause the word line driver 3 to repeat application of the forming voltage until the resistance value indicated by the count value of the memory cell read by the circuit 7b becomes lower than the resistance value calculated based on the initial count value.

As described above, the read circuit 7b reads the resistance value information on the memory cell (count value) based on the fact that the electric discharge time as a voltage is applied to a selection memory cell varies with the resistance values of the selection memory cells. Consequently, a binary digital logic value according to the resistance state of the selection memory cell is outputted to the output A.

That is, also in the read circuit 7b, in the forming, an absolutely constant resistance value is not used as a threshold value for repeating application of the forming voltage, but the threshold value is defined by the resistance value information which is obtained by multiplying an initial resistance value measured for each cell by a predetermined ratio, and it is determined whether or not the forming is completed based on thus defined threshold value.

Thus, the threshold value is automatically updated optimally and proper forming can be performed.

As described in FIG. 8, the constant current source 140 is connected to the node C via SW4. With this configuration, the system controller 9 supplies a constant current to the node C (memory cell) by turning ON/OFF SW4, and thus can increase the count value (improve the resolution of the resistance value information) by increasing the above-mentioned electrical discharge time.

Figure 11:
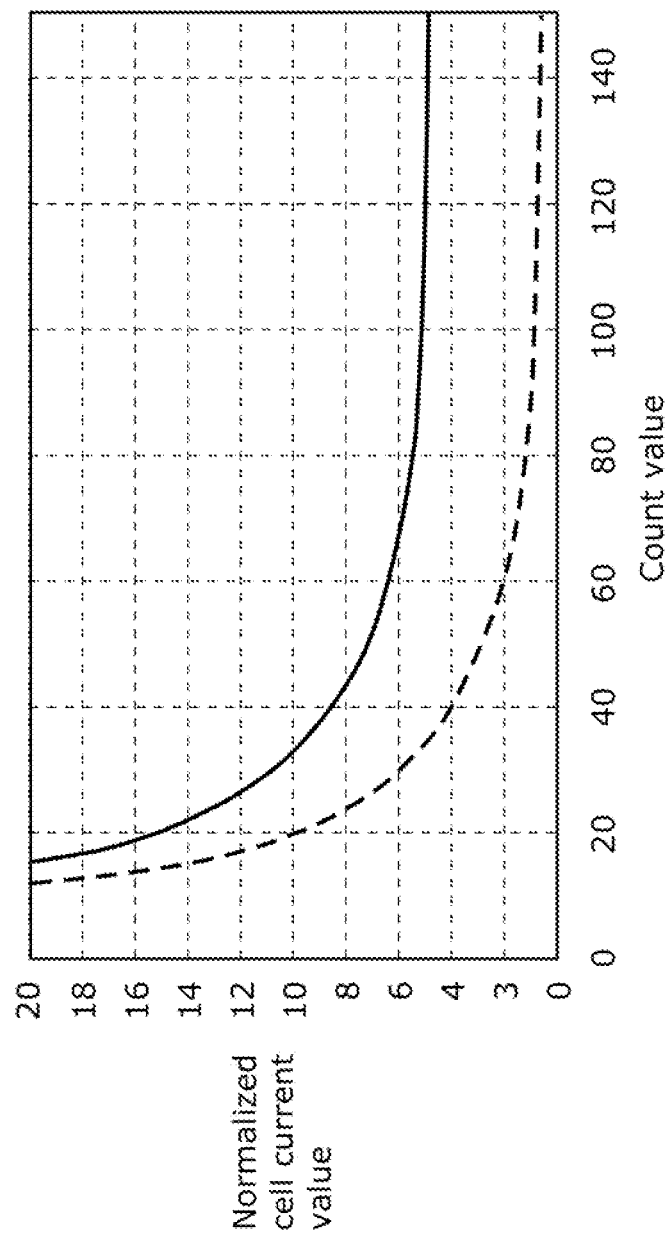
FIG. 11 is a graph illustrating the relationship between count value and normalized cell current value, the count value being read as resistance value information by the second read circuit in the present embodiment.

FIG. 11 is a graph illustrating the relationship between the normalized cell current value and the count value according to the presence or absence of the constant current source 140.

In FIG. 11, the horizontal axis indicates the count value of the counter 134, and the vertical axis indicates the normalized cell current value. Here, the normalized cell current value is a current value which is obtained by normalizing the current which is caused to flow when a predetermined voltage is applied to a memory cell, under the assumption that no leakage current occurs.

The count value on the horizontal axis indicates a count value corresponding to the resistance value information on the memory cell. That is, the correlation between the count value of the resistance value information read by the read circuit 7b and the actual cell current amount is shown.

This correlation is generally expressed by the function: cell current=$\alpha \times T^{\beta}$ (T=count value×clock cycle). The graph shown by a dotted line in FIG. 11 indicates the count value of the memory cell and the normalized cell current value when SW4 is OFF. The graph shown by a solid line in FIG. 11 indicates the count value of the memory cell and the normalized cell current value when SW4 is ON.

As seen from FIG. 11, when the normalized cell current value is the same, with SW4 turned ON, the count value is larger in the region where the cell resistance value of a selection cell is low. That is, when the normalized cell current value is the same, the resolution of the resistance value information in a low resistance value region (region where the cell current value is large) has been improved.

In this manner, the technique of increasing the count value by the constant current source 140 is effective when the forming process is repeated and the resistance value of the memory cell is reduced. This is because when the resistance value of the memory cell is low, the electrical discharge time decreases and the count value is reduced, and thus the accuracy in the measurement of the resistance value of the memory cell deteriorates. That is, by the above-mentioned technique, the measurement range for the resistance value is shifted to one of multiple ranges (count value is adjusted) from a high resistance range to a low resistance range according to the resistance value of the memory cell by turning ON or OFF SW4 and further increasing the current amount of the constant current source stepwise in N levels. In FIG. 11, only two types of representative characteristics are illustrated.

The technique for improving the measurement value of the memory cell is not limited to addition of the constant current source 140.

For example, the resolution of the resistance value information may be improved by increasing the clock frequency inputted to the counter 134. The resolution of the resistance value information may be improved by decreasing the voltage of the reference voltage Vref2 or increasing the capacity of the capacitor CC2.

In addition, the system controller 9 can freely set the resolution of the resistance value information by adjusting a predetermined current amount of the constant current source 140, the clock frequency, the reference voltage Vref2, and the capacity of the capacitor CC2. In this case, the system controller 9 can shift the measurement range so as to read a higher resistance value by decreasing the current amount of the constant current source 140, increasing the reference voltage Vref2, and/or reducing the capacity of the capacitor CC2. Conversely, the system controller 9 can shift the measurement range so as to read a lower resistance value region with high resolution by decreasing the voltage level of Vref2, increasing the current amount of the constant current source 140, and/or increasing the capacity of the capacitor CC2. It is to be noted that change of the capacity of the capacitor CC2 may be achieved by converting the capacitor CC2 to a capacitor having different capacity with a switching element or the like.

In this manner, the technique for improving the measurement accuracy by shifting the measurement range of the resistance value is significantly effective for a nonvolatile memory device using a variable resistance element which needs the forming process.

This is because there is a significant difference in resistance between an originally insulated variable resistance element of a memory cell having an extremely high resistance value and a memory cell which has undergone application of the forming voltage to have a reduced resistance value.

For example, the amount of change in the resistance value of the memory cell due to application of the forming voltage ranges in the order of several to several ten times in resistance value. In such a case, the technique for shifting the measurement range is very effective.

In general, a forming voltage applied to a memory cell in the forming is higher than a voltage used for a normal resistance change operation. When such a forming voltage is repeatedly applied similarly to an originally insulated variable resistance element of a memory cell having an extremely high resistance value and a memory cell which has undergone application of the forming voltage to have a reduced resistance value in a similar manner, an electrical stress applied to the memory cell increases as the resistance value decreases.

Particularly in the above case, as illustrated in step S110 of FIG. 10, the system controller 9 may control the forming voltage, so that the forming voltage is decreased as the resistance value indicated by the resistance value information read by the read circuit 7b decreases while application of the forming voltage is repeated. In addition, the system controller 9 may controls the forming voltage, so that the forming voltage is decreased as the resistance value indicated by the resistance value information read by the read circuit 7b decreases while application of the forming voltage is repeated.

By combining change of the measurement range and adjustment of the forming voltage, it is possible to constantly recognize the detailed current resistance value accurately and to adjust the application of the forming voltage.

When the measurement range is shifted, the correlation of the resistance value information before and after the shift of the measurement range may be acquired, so that it is possible to simply compare the forming threshold value determined from the initial resistance value information with the measurement value after the shift of the measurement range.

In a cross point memory cell array, the more a path is apart from the selection memory cell, the more slowly the leakage current starts to flow through the path. This is caused by a wiring resistance of the wiring included in the memory cell array and a parasitic capacitance in each of path routes. Therefore, the influence of the leakage current is reduced by reading the resistance value of the selection memory cell more quickly in a short time.

Because the read circuit 7b reads a resistance value in terms of electrical discharge time, the read circuit 7b can read the resistance value in a shorter time compared with the read circuit 7a according to Embodiment 1. Thus, advantageously, the read circuit 7b is not likely to be affected by the leakage current.

As described above, similarly to the first read circuit 7a, the second read circuit 7b stores the resistance value immediately before performing the forming for each memory cell, and defines a determination threshold value which is obtained by multiplying the stored resistance value by a predetermined ratio, and the threshold value thereby is automatically updated optimally and proper forming can be performed.

The read circuit 7b allows the measurement range of the resistance value to be modified easily, and even when the resistance value decreases in the process of forming, the forming can be performed with high accuracy.

In the above, the nonvolatile memory device according to an aspect of the present invention has been described based on the embodiment.

In the aforementioned embodiment, the cross point nonvolatile memory device has been described which includes memory cells, each of which has a bidirectional current control element and a variable resistance element. However, the invention is not limited to this. For example, instead of a bidirectional current control element, a unidirectional current control element may be used. The nonvolatile memory device may not be a cross point nonvolatile memory device, and may be, for example, a 1 transistor-1 resistance (1T1R) nonvolatile memory device which includes memory cells, each of which has a transistor and a variable resistance element. In the case of a nonvolatile memory device which uses a transistor for the selection cell, although change of the initial resistance value due to an increase of leakage current does not occur, variation in the resistance value for each lot and/or variation in the resistance value according to a cell position on the memory array may occur. Thus, by applying substantially the same forming method as described above, it is possible to perform the forming which is adapted to those variations.

In the above embodiment, the case has been described in which an electrical stress applied to the variable resistance element at the time of forming process is varied according to the leakage current. However, the forming method described in the embodiment may be applied to another case. For example, the forming method described in the embodiment is useful in the case where an electrical stress applied to the variable resistance element at the time of forming process is varied according to a structure variation in the memory cells.

The read circuit described in the embodiment is only an example, and the invention is not limited to the configuration described in the embodiment. For example, a capacitor is used as the memory unit in the embodiment. The memory unit, however, may have any form as long as the memory unit is capable of storing the resistance value information. For example, a capacitor used as the memory unit may be a capacitive load, and the form of the capacitor is not limited. Specifically, a capacitor used as the memory unit may be, for example, a diffusion capacitance which is highly compatible with a semiconductor process.

In the embodiment, the example has been described in which when a forming voltage is applied, a determination condition is set based on the initial resistance value information, however, the invention may be utilized, for example, when a normal write voltage is applied. For example, a nonvolatile memory device may include: a memory cell; a voltage application unit configured to apply a voltage to the memory cell; a reading unit configured to read resistance value information on the memory cell; a memory unit configured to store the resistance value information which is read from the memory cell by the reading unit; and a control unit configured to cause the memory cell to apply a voltage so as to satisfy a condition which is set based on the resistance value information stored by the memory unit.

This general or specific aspect may be implemented in the form of a system, a method, an integrated circuit, a computer program, or a recording medium, and may be implemented in any combination of a system, a method, an integrated circuit, a computer program, and a recording medium.

The present invention is not limited to these embodiments or their modifications. As long as not departing from the spirit of the present invention, modified embodiments obtained by making various variations, which occur to those skilled in the art, to the above embodiments and modifications, and the embodiments that are constructed by combining the components in different embodiments and modifications are also included in the scope of the present invention.

INDUSTRIAL APPLICABILITY

The present invention is applicable to nonvolatile memory devices, particularly to a nonvolatile memory device including a variable resistance element having a resistance stably changeable through appropriate forming on the variable resistance element.

REFERENCE SIGNS LIST 1, 2, 500 Memory cell
3 Word line driver
4 Bit line driver
5 Variable resistance element
6 Bidirectional current control element
7, 7a, 7b Read circuit
9 System controller
10 Host interface
20a Resistance information hold circuit
130 Reference voltage generation circuit
131 Driver
132 Level comparator
133 Threshold value counter memory
134 Counter
135 Comparator
136 m/n calculation unit
140 Constant current source
501 First electrode Layer
502 Bidirectional current control element
504, 505 Variable resistance layer
506 Second electrode Layer
507 Upper wiring
508 Lower wiring
CC, CC2 Capacitor
WL1 to WL5 Word line
BL10 to BL40 Bit line

The invention claimed is:
1. A nonvolatile memory device, comprising:
a memory cell having a variable resistance element which is changed to a resistance state which is reversibly changeable according to an electrical pulse, the change being caused by application of a forming voltage to the memory cell;

a voltage application unit configured to apply the forming voltage to the memory cell;

a reading unit configured to read resistance value information on the memory cell;

a memory unit configured to store the resistance value information read by the reading unit as initial resistance value information before the forming voltage is applied to the memory cell, the resistance value information being read from the memory cell;

a control unit configured to control the voltage application unit and the reading unit to cause the voltage application unit to repeat application of the forming voltage to the memory cell and to cause the reading unit to repeat reading of the resistance value information on the memory cell until the resistance value information on the memory cell read by the reading unit satisfies a condition which is set based on the initial resistance value information; and a calculation unit configured to output calculated resistance value information which is obtained by multiplying the initial resistance value information by a predetermined coefficient, wherein the control unit is configured to control the voltage application unit and the reading unit to cause the voltage application unit to repeat application of the forming voltage to the memory cell and to cause the reading unit to repeat reading of the resistance value information on the memory cell until a resistance value indicated by the resistance value information on the memory cell read by the reading unit becomes lower than a resistance value indicated by the calculated resistance value information.

2. The nonvolatile memory device according to claim 1,
wherein the control unit is configured to control the voltage application unit and the reading unit to cause the voltage application unit to repeat application of the forming voltage to the memory cell and to cause the reading unit to repeat reading of the resistance value information on the memory cell until a resistance value indicated by the resistance value information on the memory cell becomes lower than a resistance value indicated by the initial resistance value information.

3. The nonvolatile memory device according to claim 1,
wherein the reading unit is a counter circuit which reads a count value as the resistance value information, the count value being obtained by counting an electrical discharge time in a predetermined cycle, the electrical discharge time being a time period after a predetermined read voltage is applied to both ends of the memory cell until a voltage between the both ends of the memory cell decreases to a predetermined reference voltage, the memory unit is a latch circuit which stores the initial resistance value information read from the memory cell by the counter circuit before forming is performed on the memory cell, and the calculation unit is a digital calculation circuit which outputs the calculated resistance value information which is obtained by multiplying the initial resistance value information by the predetermined coefficient.

4. The nonvolatile memory device according to claim 3, further comprising a constant current drive circuit which causes a predetermined current to flow through the memory cell based on control performed by the control unit, wherein the control unit is configured to (i) adjust the resistance value information by increasing the electrical discharge time using the predetermined current, and (ii) control the voltage application unit and the reading unit to cause the voltage application unit to repeat application of the forming voltage to the memory cell and to cause the reading unit to repeat reading of the resistance value information on the memory cell until a resistance value indicated by the adjusted resistance value information becomes lower than the resistance value indicated by the calculated resistance value information.

5. The nonvolatile memory device according to claim 4,
wherein the control unit is configured to adjust the resistance value information by performing at least one of decreasing the predetermined reference voltage, increasing the predetermined current, and increasing the predetermined read voltage as a resistance value indicated by the resistance value information read by the counter circuit decreases while application of the forming voltage is repeated.

6. The nonvolatile memory device according to claim 4,
wherein the reading unit includes a capacitor connected in parallel to the memory cell, and the control unit is configured to adjust the resistance value information by increasing a capacity of the capacitor as a resistance value indicated by the resistance value information acquired by the counter circuit decreases while application of the forming voltage is repeated.

7. The nonvolatile memory device according to claim 1,
wherein the control unit is configured to control the forming voltage so that the forming voltage is decreased as a resistance value indicated by the resistance value information read by the reading unit decreases while application of the forming voltage is repeated.

8. The nonvolatile memory device according to claim 1,
wherein the control unit is configured to control a pulse width of the forming voltage, so that the pulse width is reduced as a resistance value indicated by the resistance value information read by the reading unit decreases while application of the forming voltage is repeated.

9. The nonvolatile memory device according to claim 1,
wherein the reading unit includes a fixed resistor connected in series to the memory cell, and a capacitor connected in parallel to the fixed resistor to serve as the memory unit by storing a potential of the fixed resistor, and the reading unit is configured to read a potential of the fixed resistor as the resistance value information, the potential being caused by a current which flows from the memory cell through the fixed resistor after a predetermined read voltage is applied to both ends of the memory cell.

10. The nonvolatile memory device according to claim 1, further comprising a memory cell array which includes a plurality of the memory cells, wherein the reading unit is configured to read resistance value information of a subsequent memory cell after the condition is satisfied by the resistance value information on the memory cell, and the memory unit is configured to store an initial resistance value of the subsequent memory cell.

11. The nonvolatile memory device according to claim 5,
wherein using a second threshold value which is set to be lower than a first threshold value which is defined as the calculated resistance value information obtained by multiplying the initial resistance value information by the predetermined coefficient, the control unit is configured (i) to determine whether or not the resistance value information acquired by the counter circuit is lower than the second threshold value, and (ii) to adjust the resistance value information to cause the resistance value information to exceed the second threshold value by performing the at least one of decreasing the predetermined reference voltage, increasing the predetermined current, and increasing the predetermined read voltage when the resistance value information acquired by the counter circuit is determined to be lower than the second threshold value while application of the forming voltage is repeated.

12. A method of performing a forming operation on a nonvolatile memory device which applies a forming voltage to a memory cell having a variable resistance element to change the variable resistance element to a resistance state which is reversibly changeable according to an electrical pulse, the method comprising:
storing resistance value information as initial resistance value information, the resistance value information being read from the memory cell;
applying the forming voltage to the memory cell after the storing of the initial resistance value information;
reading resistance value information from the memory cell after the applying of the forming voltage to the memory cell;
calculating resistance value information which is obtained by multiplying the initial resistance value information by a predetermined coefficient;
determining whether or not a resistance value indicated by the resistance value information read in the reading is lower than a resistance value indicated by the calculated resistance value information; and
repeating the applying of the forming voltage to the memory cell, the reading of the resistance value information from the memory cell, and the determining until the determining determines that the resistance value indicated by the resistance value information on the memory cell becomes lower than the resistance value indicated by the calculated resistance value information.

13. The method of performing forming on a nonvolatile memory device according to claim 12,
wherein the nonvolatile memory device comprises a memory cell array which includes a plurality of memory cells including the memory cell, and
when the determining determines that the resistance value indicated by the resistance value information on the memory cell becomes lower than the resistance value indicated by the calculated resistance value information, the storing of initial resistance value information, the applying of the forming voltage, the reading of resistance value information, the calculating of the resistance value information, the determining, and the repeating are performed on another memory cell.

* * * * *